United States Patent
Forrest

(10) Patent No.: US 8,143,613 B2
(45) Date of Patent: Mar. 27, 2012

(54) ORGANIC LIGHT EMITTING DEVICE HAVING MULTIPLE SEPARATE EMISSIVE LAYERS

(75) Inventor: Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 1155 days.

(21) Appl. No.: 11/945,910

(22) Filed: Nov. 27, 2007

(65) Prior Publication Data
US 2011/0215301 A1 Sep. 8, 2011

(51) Int. Cl.
*H01L 29/06* (2006.01)

(52) U.S. Cl. .............. 257/13; 257/40; 257/90; 257/98; 257/E33.001; 313/504

(58) Field of Classification Search .......... 257/13, 257/76, 78, 79–103, 918, 40; 313/504
See application file for complete search history.

(56) References Cited

U.S. PATENT DOCUMENTS

| | | | |
|---|---|---|---|
| 7,009,338 B2 | 3/2006 | D'Andrade et al. | |
| 2004/0046495 A1 | 3/2004 | Peng | |
| 2006/0240279 A1 | 10/2006 | Adamovich et al. | |
| 2006/0273714 A1 | 12/2006 | Forrest et al. | |
| 2007/0116983 A1* | 5/2007 | Kanno et al. | 428/690 |

OTHER PUBLICATIONS

Evan L. Williams et al., "Excimer-Based White Phosphorescent Organic Light Emitting Diodes with Nearly 100% Internal Quantum Efficiency," Adv. Mat 2007, 19, 197-202.
Gufeng HE et al., "High-efficiency and low-voltage p-i-n electrophosphorescent organic light-emitting diodes with double-emission layers," Appl. Phys. Lett. 85, 17, 3911-13, Oct 25, 2004.
X. Zhou et al., "High-efficiency electrophosphorescent organic light-emitting diodes with double light-emitting layers," Appl. Phys. Lett., 81, 21, 4070-72, Nov. 18, 2002.
Xue-Yin Jiang et al., "Highly-efficient and stable white organic light emitting diode with triply doped structure," Displays 27 (2006) 161-65.
M.S. Kim et al., "White organic light-emitting diodes from three emitter layers," Thin Solid Films 515 (2006) 891-95.
M.A. Baldo et al., "Transient analysis of organic electrophosphorescence: I. Transient analysis of triplet energy transfer," Phys. Rev. B, 62, 16, 10958-966, Oct. 15, 2000.
I. G. Hill et al., "Organic semiconductor heterointerfaces containing bathocuproine," J. Appl. Phys. 86, 8, 4515-19, Oct. 15, 1999.
R. J. Holmes et al., Efficient, deep-blue organic electrophosphorescence by guest charge trapping, Appl. Phys. Lett. 83, 18, 3818-20, Nov. 3, 2003.

(Continued)

*Primary Examiner* — Evan Pert
*Assistant Examiner* — Scott R Wilson
(74) *Attorney, Agent, or Firm* — Kenyon & Kenyon LLP

(57) ABSTRACT

An organic light emitting device having multiple separate emissive layers is provided. Each emissive layer may define an exciton formation region, allowing exciton formation to occur across the entire emissive region. By aligning the energy levels of each emissive layer with the adjacent emissive layers, exciton formation in each layer may be improved. Devices incorporating multiple emissive layers with multiple exciton formation regions may exhibit improved performance, including internal quantum efficiencies of up to 100%.

29 Claims, 28 Drawing Sheets

OTHER PUBLICATIONS

Yoshiyuki Kuwabara et al., Thermally Stable Multilayered Organic Electroluminescent Devices Using Novel Starburst Molecules, 4, 4', 4"-Tri(N-carbazolyl)triphenylamine (TCTA) and 4, 4', 4"-Tris(3-methylphenylphenyl-amino) triphenylamine (m-MTDATA) as Hole-Transport Materials, Adv. Mat. 1994, 6, 9, 677-79.

V. Bulovic et al., "Weak microcavity effects in organic light-emitting devices," Phys. Rev. B 58, 7, 3730-40, Aug. 15, 1998.

Yiru Sun et al., "Management of singlet and triplet excitons for efficient white organic light-emitting devices," Nature Lett. 440, 908-12, Apr. 13, 2006.

Ji Hoon Seo et al., "Highly efficient white organic light-emitting diodes using two emitting materials for three primary colors (red, green, and blue)," Appl. Phys. Lett. 90, 203507, 1-3 (2007).

Brian W. D'Andrade et al., "Efficient Organic Electrophosphorescent White-Light-Emitting Device with a Triple Doped Emissive Layer," Adv. Mat. 2004, 16, 7, 624-28.

Brian W. D'Andrade et al., "White Organic Light-Emitting Devices for Solid-State Lighting," Adv. Mat. 2004, 16, 18, 1585-95.

M. Cocchi et al., "Single-dopant organic white electrophosphorescent diodes with very high efficiency and its reduced current density roll-off," Appl. Phys. Lett. 90, 163508, 1-3 (2007).

H. Kanno et al., "White Stacked Electrophosphorescent Organic Light-Emitting Devices Employing $MoO_3$ as a Charge-Generation Layer," Adv. Mat. 2006, 18, 339-42 (2006).

Gang Cheng et al., "White organic light-emitting devices with a phosphorescent multiple emissive layer," Appl. Phys. Lett 89, 043504, 1-3 (2006).

M. A. Baldo et al., "Transient Analysis of organic electrophosphorescence. II. Transient analysis of triplet-triplet annihilation," Phys. Rev. B 62, 16, 10967-977, Oct. 15, 2000.

PCT International Search Report and Written Opinion from PCT/US2008/079055, mailed on Feb. 10, 2009.

Sun et al., 2007, "High Efficiency white organic light emitting devices with three separate phosphorescent emission layers", Appl. Physics Letters 91:263503-1 to 263503-3.

* cited by examiner

US 8,143,613 B2

ORGANIC LIGHT EMITTING DEVICE HAVING MULTIPLE SEPARATE EMISSIVE LAYERS

GOVERNMENT RIGHTS

This invention was made with U.S. Government support under Contract No. DE-FC26-04NT42272 awarded by the Department of Energy. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices. More specifically, the invention relates to organic light emitting devices having multiple emissive layers and multiple exciton formation regions.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may comprise a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

DETAILED DESCRIPTION

Figure 1:
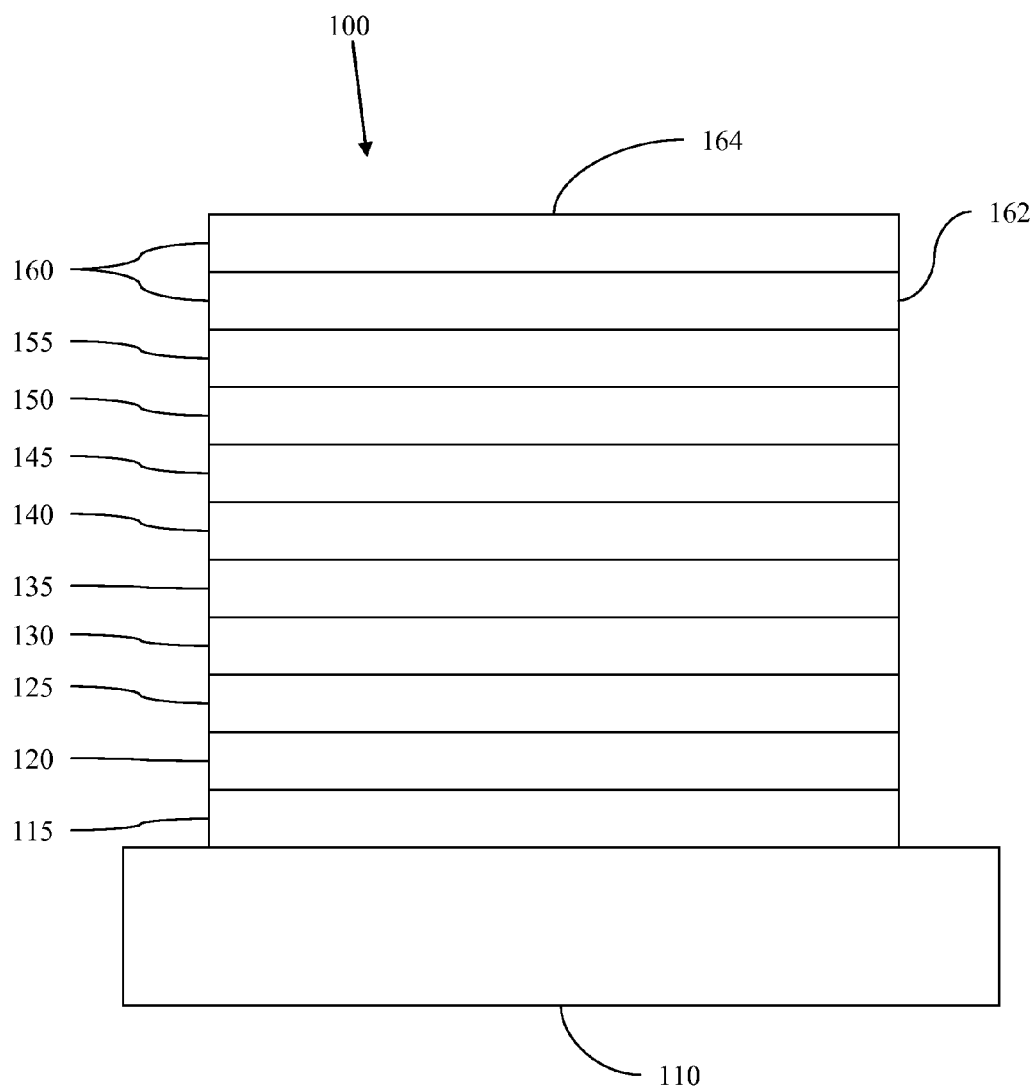
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or undoped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers comprise a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
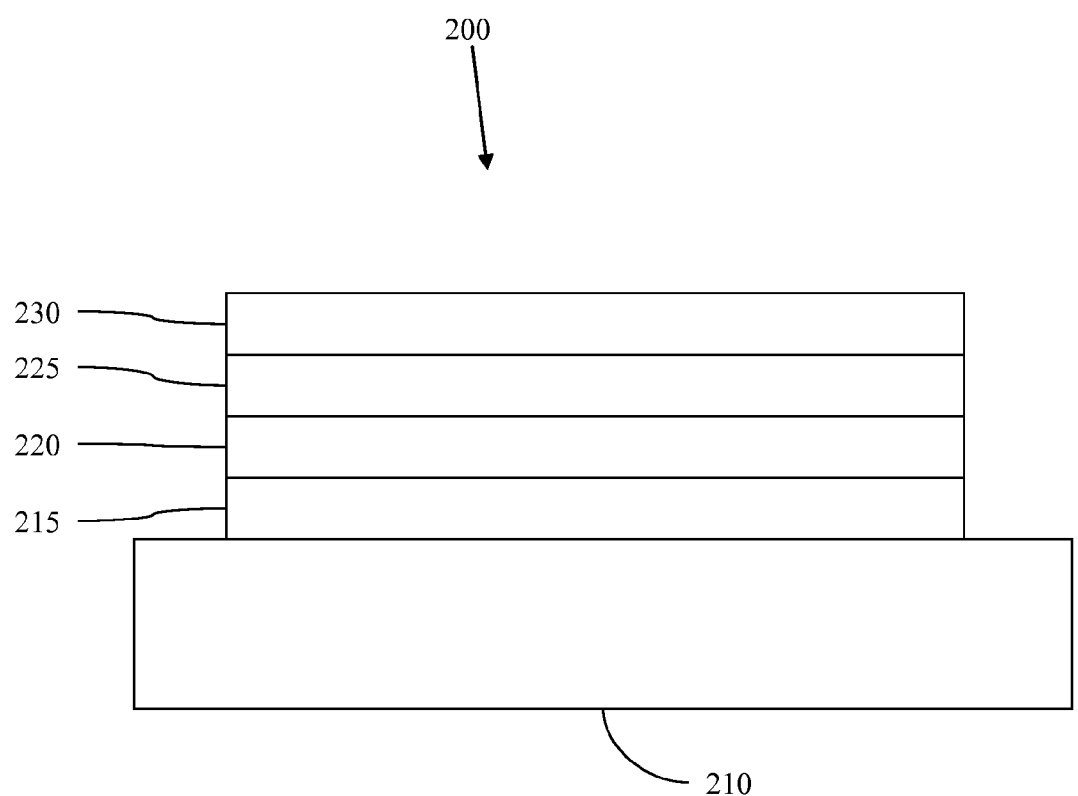
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprising polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

White organic light emitting devices (WOLEDs) may be of interest for uses such as display backlighting and interior illumination applications. Recent results have shown electrophosphorescent WOLEDs that now exceed incandescent bulbs in terms of power efficiencies and lifetimes, although some have a low color rendering index (CRI$\leq$75), while others exhibit significant efficiency roll-off at high brightnesses required for attractive light sources. In conventional electrophosphorescent OLEDs, the exciton formation zone is located in the emission layer (EML) adjacent to one or both adjacent carrier transport layers. This may result in a "pile-up" of excitons at the EML, which can cause enhanced triplet-triplet annihilation.

Figure 3:
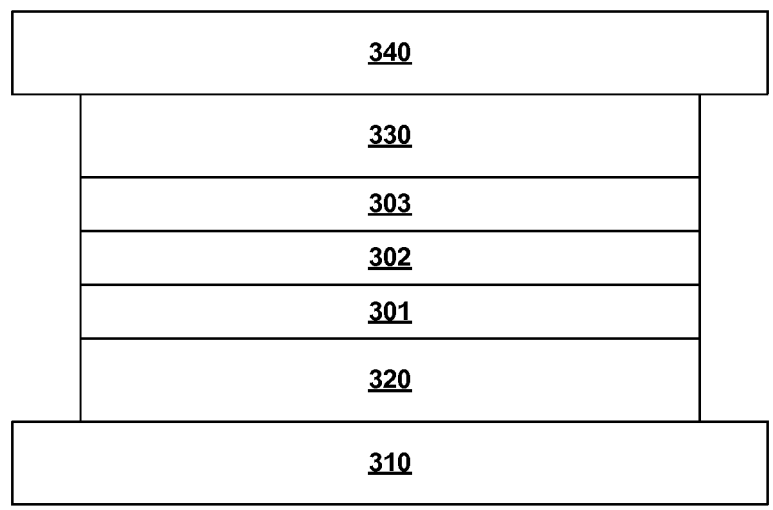
FIG. 3 shows an organic light emitting device having three separate emissive layers.

A device having multiple emissive layers is provided. FIG. 3 shows an exemplary device having three emissive layers 301, 302, 303 disposed between a cathode 340 and an anode/substrate 310. The device may include other layers 320, 330 as previously described, such injection layers, blocking layers, and transport layers, and may be fabricated by depositing the layers shown in order. Preferably, each emissive layer 301, 302, 303 is adapted to emit a different spectrum of light. It may be preferred that a combined emission of the organic emissive layers sufficiently spans the visible spectrum to produce white light. For example, three emissive layers 301, 302, 303 may emit red, green, and blue light, respectively. When viewed, the combined emission from the device may appear white. As previously described, each emissive layer may include a host material and a dopant. The host material for each emissive layer may be the same or it may be different. Any combination of dopants may be used. Preferably, the dopant in each emissive layer emits a different spectrum of light than at least one other dopant, and more preferably each dopant emits a different spectrum of light.

In a three emission-layer (EML) device, three ambipolar materials with different (small to large) HOMO-LUMO gaps may be used as hosts in the three EMLs. The layers may be doped with red, green, and blue dopants respectively if a white-emitting device is desired. Other dopant combinations may be used. Phosphorescent dopants may be preferred, though any suitable dopant may be used. These three bipolar layers may result in exciton formation in multiple regions, instead of at one interface as in conventional device structures. This expansion of the exciton generation region may suppress or reduce exciton annihilation effects, which may allow formed excitons more chances to radioactively decay through phosphors in all the exciton formation regions. This may lead to noticeably higher efficiencies of this device, even compared to mono-color OLEDs.

Materials used in a multiple-EML device may be selected to have energy levels that are aligned to energy levels of adjacent materials. As used herein, a HOMO or LUMO energy level is "aligned" to an energy level of an adjacent material if the energy level and the HOMO or LUMO are within about 15 kT, more preferably about 10-15 kT, and more preferably about 5-10 kT of each other. Thus, at room temperatures, energy levels are "aligned" when they are within about 0.4 eV, more preferably about 0.25-0.4 eV, and more preferably about 0.1-0.25 eV of each other. When an energy level (HOMO or LUMO) of a host material is aligned to the corresponding HOMO or LUMO energy level of an adjacent dopant and/or host, exciton formation within each layer and/or at each interface may increase, providing for more efficient exciton formation and emission than occurs in conventional devices. When energy levels of adjacent emissive layer host and dopant materials are aligned, more charge carriers may transition directly to dopant molecules from adjacent layers.

Figure 4:
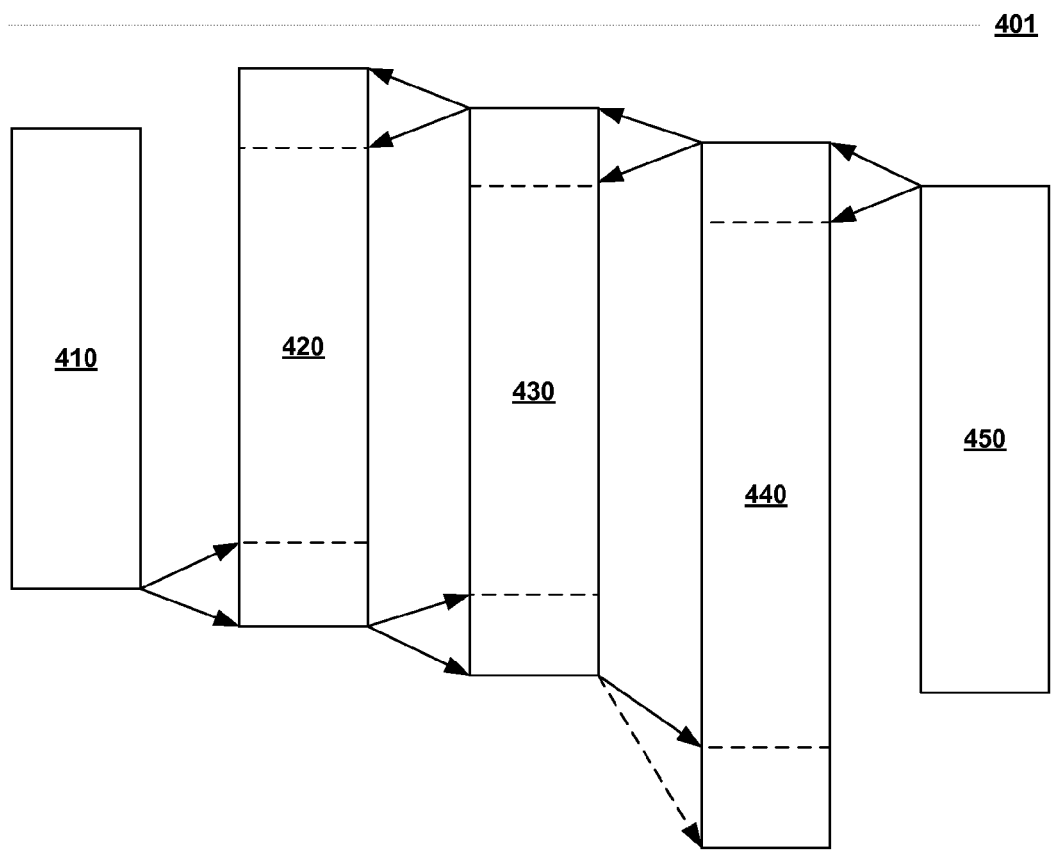
FIG. 4 shows a schematic energy level diagram for a three-EML device.

FIG. 4 shows an exemplary energy level diagram for a three-EML device, where each emissive layer defines an exciton formation region. Three emissive layers 420, 430, 440 may be disposed between outer layers 410, 450. These layers may be electrodes, charge injection layers, and/or charge transport layers as previously described. For example, layer 410 may be an anode or other layer that injects holes, and layer 450 may be a cathode or other layer that injects electrons. FIG. 4 shows the energy levels of each emissive layer host (solid lines) and the corresponding dopant (dashed lines) relative to the vacuum energy level 401. In such a diagram, electrons are described as moving across the LUMO levels of each layer from the cathode 450 to the anode 410, with transitions from a lower LUMO to a higher LUMO being preferred. Thus, an electron moving from the injecting layer 450 to the third emissive layer 440 typically will transition to the LUMO of the emissive layer host material. However, if both the LUMO of the host and the LUMO of the dopant are aligned with the LUMO of the injecting layer 450, some electrons may transition to each host and dopant energy level. Similarly, if the LUMO energy levels of both the host and dopant of the second emissive layer 430 are aligned to the LUMO level of the emissive layer 440 host, some electrons may transition to each of the host and dopant LUMO levels of the second layer 430. Thus, more electrons may localize on dopant molecules in each layer than would be expected based on a conventional analysis of a single emissive layer. Since the electrons can transition to adjacent dopant and host energy levels, there may be a reduced build-up of charge at the layer interface.

In the exemplary energy level diagram of FIG. 4, holes typically would be described as moving across the HOMO levels of the layers from the anode 410 to the cathode 450, with transitions from a higher energy level to a lower level being preferred. However, if the HOMO energy level of a host is aligned to the HOMO energy level of the dopant of an adjacent level, some holes also may transition to dopant molecules. For example, holes may transition from the first emissive layer 420 HOMO level to both the host and dopant HOMO energy levels of the second emissive layer 430.

When an electron and a hole localize on the same molecule (typically a dopant molecule), they form an exciton. Since structures similar to that illustrated in FIG. 4 encourage charge carriers to localize on both the host and dopant energy levels of each emissive layer, exciton formation in each emissive layer dopant may be greater than would be expected for other single-layer devices, even where the single emissive layer has multiple dopants. Thus, a device having multiple emissive layers with multiple exciton formation regions may allow for all potential excitons to form and localize on dopant molecules, which can greatly improve the efficiency of the device. As described herein, devices having multiple emissive layers configured as described may have up to 100% internal quantum efficiency.

In some cases, it may be preferred for some energy levels to reduce or prevent charge carrier transitions from one layer to another. For example, in the structure illustrated in FIG. 4 the third emissive layer 440 may be the "last chance" for holes to form an exciton, since there are no further transitions available that would place the hole in another emissive layer. In this situation, it may be preferable for the host energy level of the emissive layer 440 not to be aligned with the host HOMO of the previous emissive layer 430. This may prevent or inhibit hole transitions to the host HOMO, and increase or encourage transitions to the dopant HOMO. As more holes are "forced" to transition to the dopant the chance of exciton formation may be increased, which may improve the efficiency of the device.

Figure 5A:
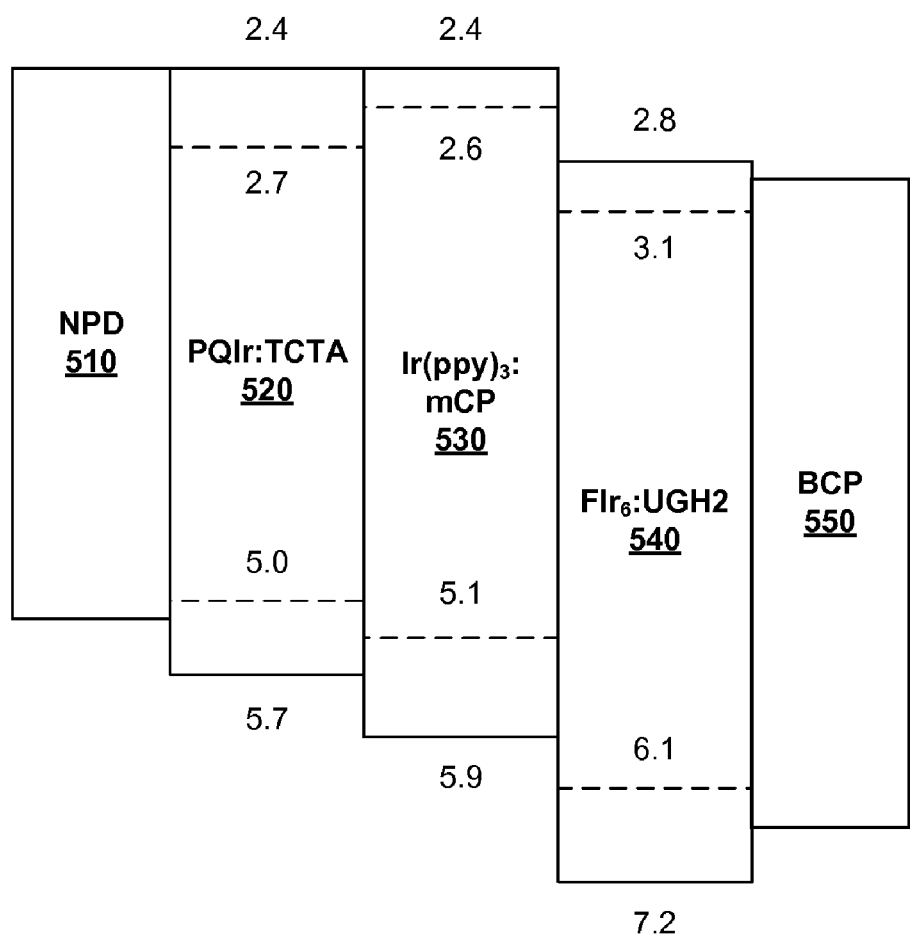
FIG. 5A shows a white organic light emitting device having three emissive layers.
Figure 5B:
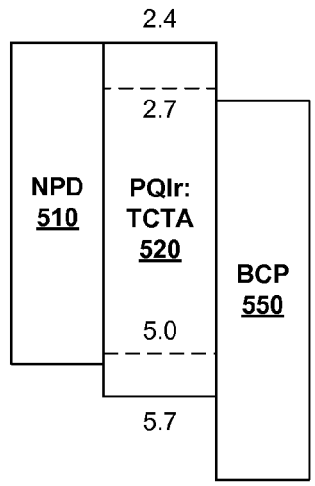
FIGS. 5B-5D show the emissive layers of the device illustrated in FIG. 5A configured in separate devices.
Figure 5C:
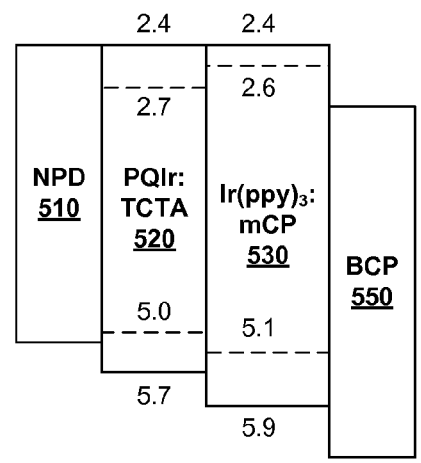
Figure 5D:
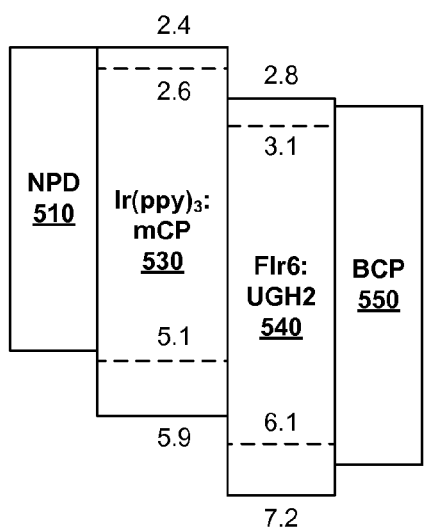

An exemplary three-EML white OLED (WOLED) is shown in FIG. 5A. The device may be described as the combination and development of three mono-color devices, as sown in FIGS. 5B-D, with the following structures and characteristics:

| Device | Structure | Max. EQE |
|---|---|---|
| Red (FIG. 5B) | NPD 40 nm/8% PQIr: TCTA 25 nm/BCP 40 nm | 6.4% |
| Green (FIG. 5C) | NPD 40 nm/TCTA 10 nm/10% Irppy: MCP 25 nm/BCP 40 nm/ LiF 0.8 nm/Al 60 nm | 9.6% |
| Blue (FIG. 5D) | NPD 40 nm/MCP 15 nm/22% FIr6: UGH2 20 nm/BCP 40 nm/ LiF 0.8 nm/Al 60 nm | 7.2% |

In the blue device (FIG. 5D), MCP works as an electron blocking layer (EBL), and has a smaller HOMO-LUMO gap compared to the host material UGH2 in the EML. The combination of the HOMO of MCP and of the blue dopant FIr6 in the EML results in efficient hole injection (HIL) to the dopant, which can help enhance efficiency and lower the driving voltage. TCTA functions similarly in these 2 aspects in the green device. Notably, the single-color devices all have maximum external quantum efficiencies (EQE) of less than 10%.

In the three-EML WOLED, the MCP and TCTA layers are doped with Ir(ppy)$_3$ and PQIr respectively. Thus, each of these layers functions as both an EML for longer-wavelength emission, and as a EBL/HIL to the adjacent shorter-wavelength EML to its right.

Figure 6:
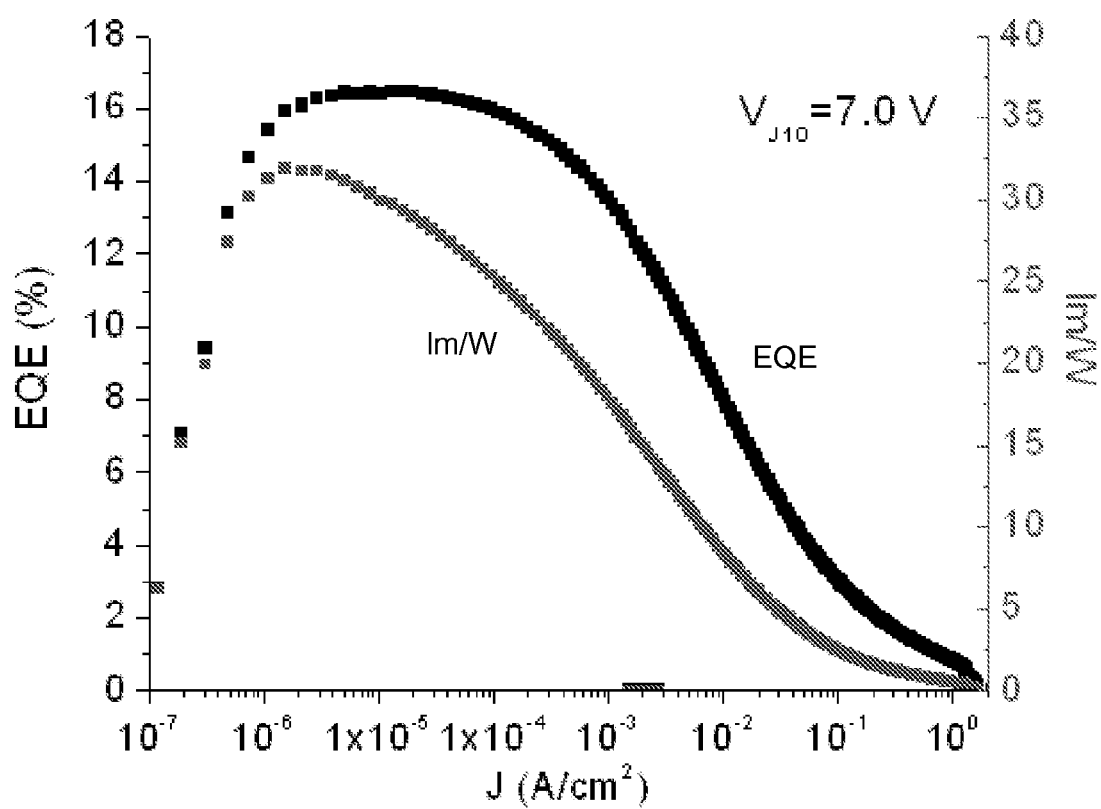
FIG. 6 shows the efficiencies of an organic light emitting device having three emissive layers.

Electrons and holes that enter the multi-EML system via bipolar host materials are slowed down, and are more likely to recombine in the 3 doped EMLs rather than highly accumulating at the high barrier of the interfaces as would be expected in a conventional single-EML device. The expanded exciton generation region can depress the exciton annihilation effect due to reduced local density of excitons, and thus lead to higher EQE of 16.6% and PE of 32 lm/W. At 500 cd/m$^2$, the EQE is 12.3% and the PE is 15.5 μm/W. The efficiency performances are shown in FIG. 6. Noticeably, the EQE of the 3-EML WOLED is higher than the mono-color OLEDs discussed above. This confirms the excitons are better utilized in the multi-exciton-generation-region WOLED.

To better understand the exciton formation region in the 3-EML WOLED, a series of devices (Series A) was fabricated using the following structure: NPD 37 nm/TCTA 8 nm/1% Ir(ppy)$_3$:MCP 4 nm/MCP x nm/22% FIr6:UGH2 20 nm/BCP 40 nm, where x is varied from 7 to 20 nm. Observed spectra, efficiencies, and structures are presented below. The applied current densities indicate the corresponding reference numerals in the spectra plots.

Figure 7A:
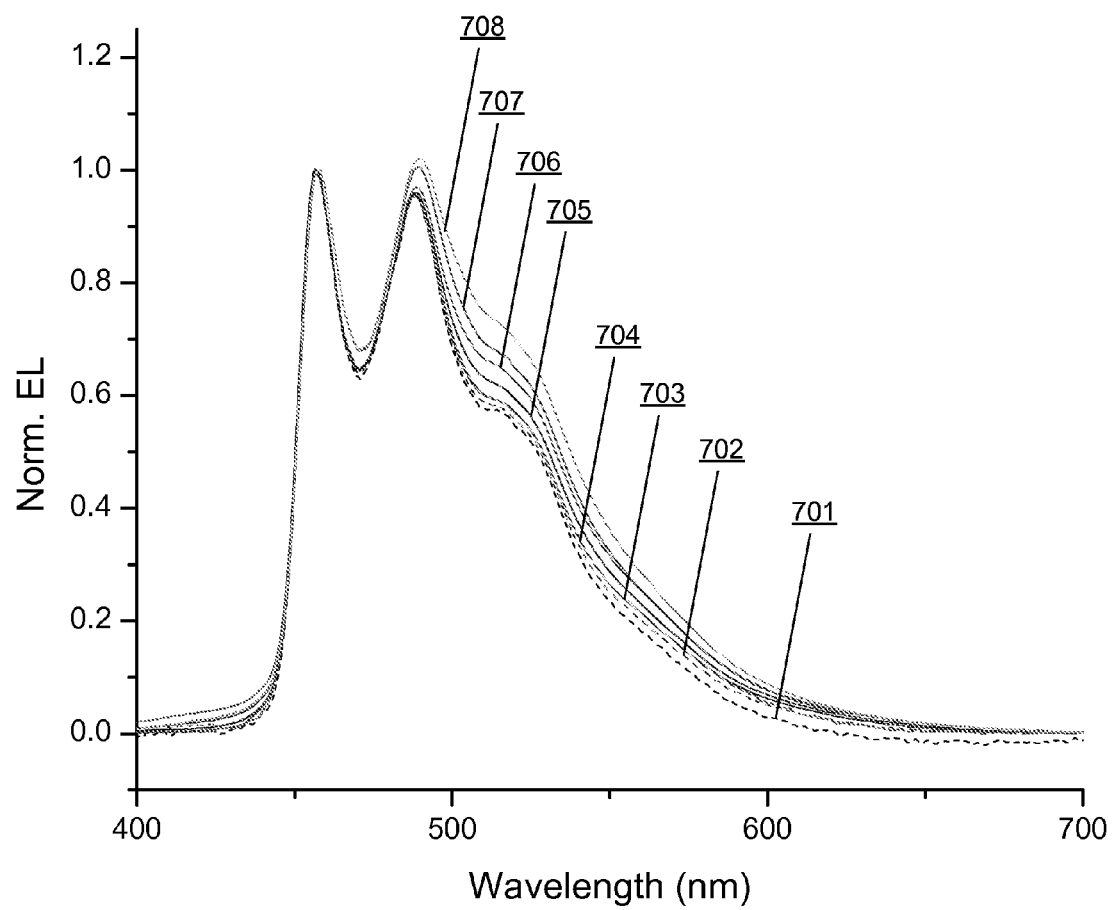
FIG. 7A shows the spectra of an organic light emitting device incorporating features from a three-emissive layer device.
Figure 7B:
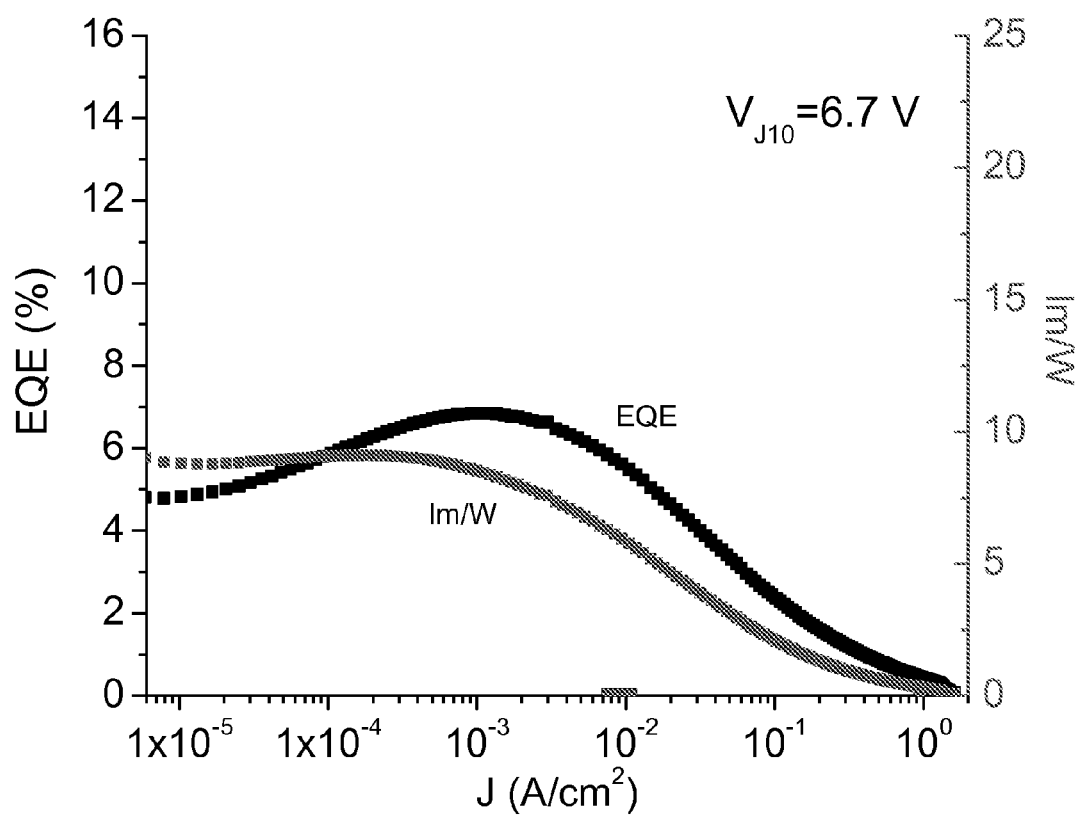
FIG. 7B shows the efficiencies of an organic light emitting device incorporating features from a three-emissive layer device.
Figure 7C:
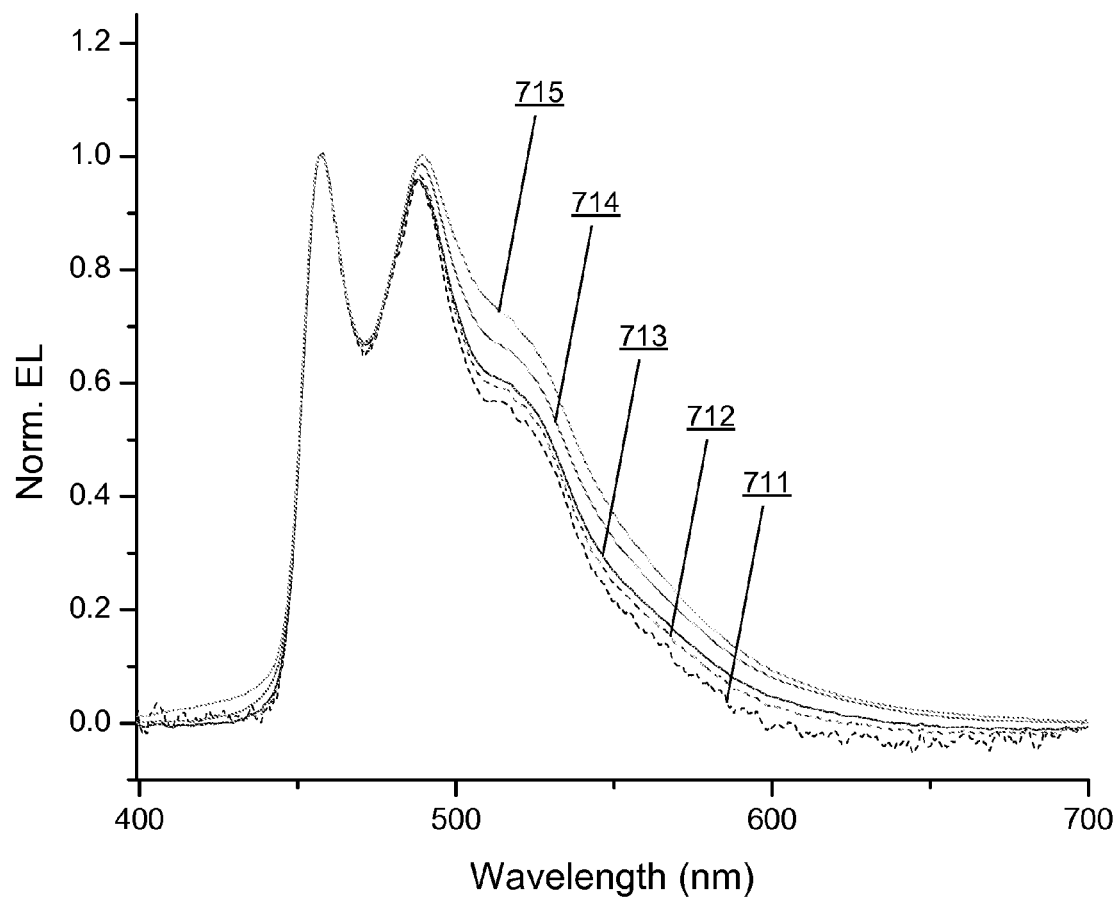
FIG. 7C shows the spectra of an organic light emitting device incorporating features from a three-emissive layer device.
Figure 7D:
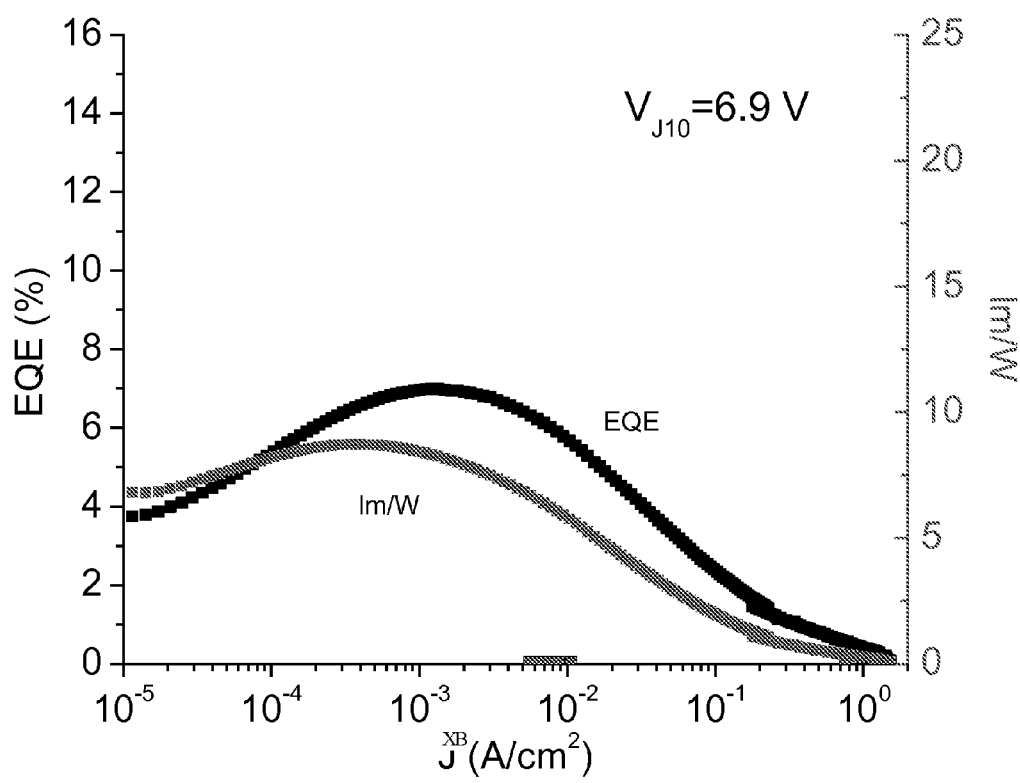
FIG. 7D shows the efficiencies of an organic light emitting device incorporating features from a three-emissive layer device.
Figure 7E:
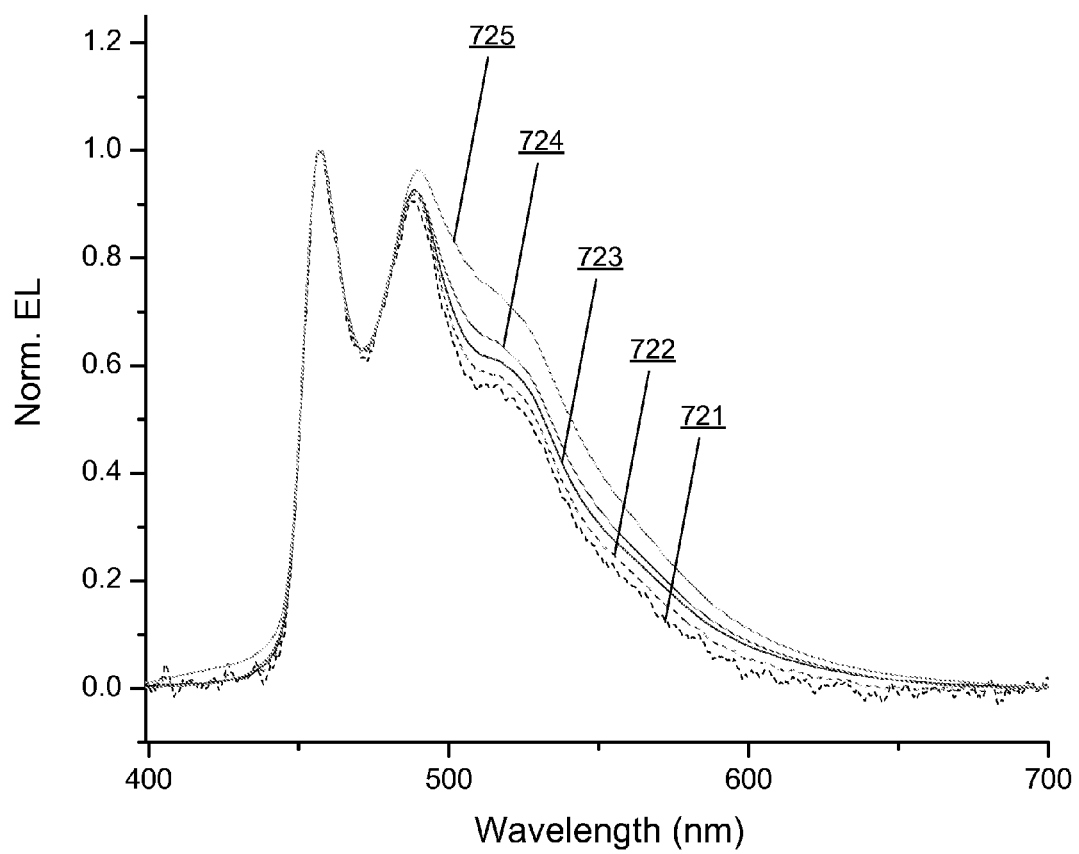
FIG. 7E shows the spectra of an organic light emitting device incorporating features from a three-emissive layer device.
Figure 7F:
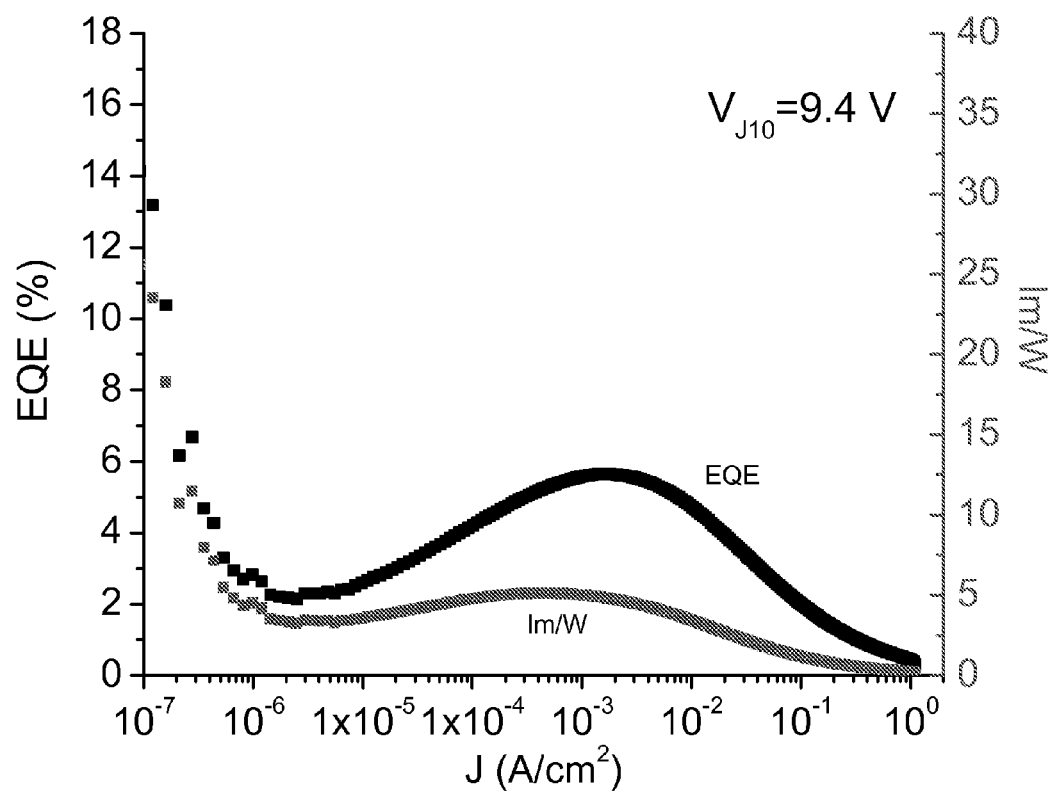
FIG. 7F shows the efficiencies of an organic light emitting device incorporating features from a three-emissive layer device.

| MCP Thickness | Spectra & Efficiency Plots | EQE | PE | Applied Current Densities |
|---|---|---|---|---|
| 7 nm | FIGS. 7A-B | 6.8% | 9.1 lm/W | 0.3 mA/cm$^2$ (701) |
| | | | | 0.5 mA/cm$^2$ (702) |
| | | | | 1 mA/cm$^2$ (703) |
| | | | | 3 mA/cm$^2$ (704) |
| | | | | 10 mA/cm$^2$ (705) |
| | | | | 30 mA/cm$^2$ (706) |
| | | | | 50 mA/cm$^2$ (707) |
| | | | | 100 mA/cm$^2$ (708) |
| 11 nm | FIGS. 7C-D | 7.0% | 8.7 lm/W | 0.3 mA/cm$^2$ (711) |
| | | | | 0.5 mA/cm$^2$ (712) |
| | | | | 1 mA/cm$^2$ (713) |
| | | | | 10 mA/cm$^2$ (714) |
| | | | | 100 mA/cm$^2$ (715) |
| 20 nm | FIGS. 7E-F | 5.6% | 5.1 lm/W | 0.3 mA/cm$^2$ (721) |
| | | | | 0.5 mA/cm$^2$ (722) |
| | | | | 1 mA/cm$^2$ (723) |
| | | | | 10 mA/cm$^2$ (724) |
| | | | | 100 mA/cm$^2$ (725) |

Figure 7G:
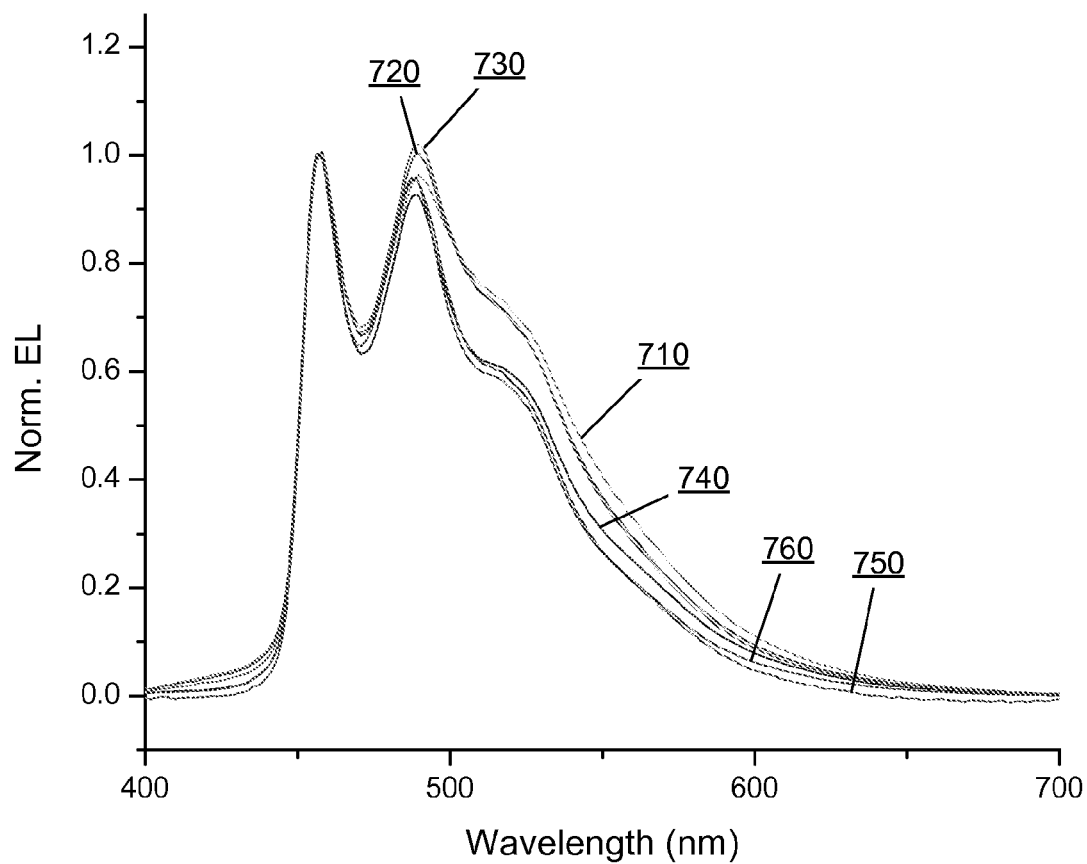
FIG. 7G shows the spectra of an organic light emitting device incorporating features from a three-emissive layer device.

The spectra for the devices with x=7, 11, and 20 were observed to be the same at a specific current density (J), and Ir(ppy)$_3$ emission was found to increase with J. FIG. 7G shows the spectra of these 3 devices at 1 mA/cm$^2$ and 100 mA/cm$^2$:

| FIG. 7G Reference | Current Density | MCP Thickness |
|---|---|---|
| 710 | 100 mA/cm$^2$ | 20 nm |
| 720 | 100 mA/cm$^2$ | 11 nm |
| 730 | 100 mA/cm$^2$ | 7 nm |
| 740 | 1 mA/cm$^2$ | 20 nm |
| 750 | 1 mA/cm$^2$ | 11 nm |
| 760 | 1 mA/cm$^2$ | 7 nm |

These 3 devices have similar quantum efficiencies of around (6.5±0.6) %.

Figure 8A:
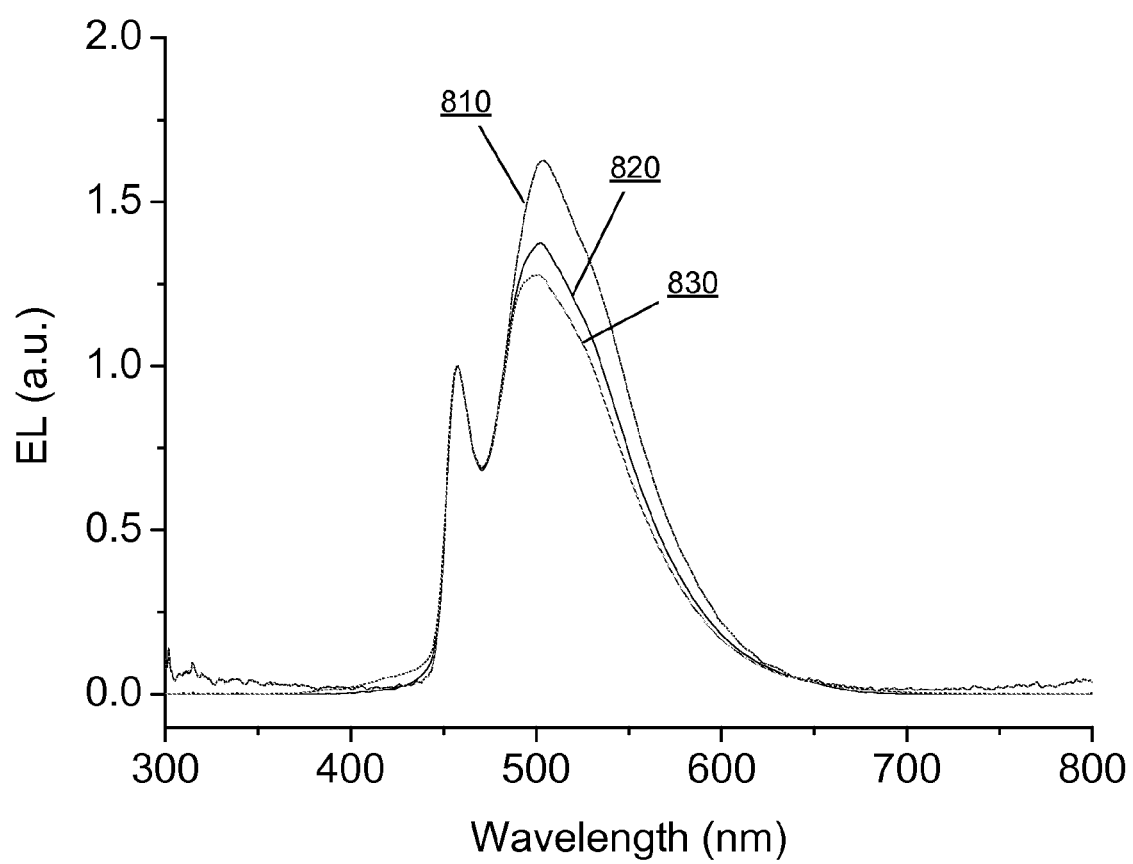
FIG. 8A shows the spectra of an organic light emitting device incorporating features from a three-emissive layer device.
Figure 8B:
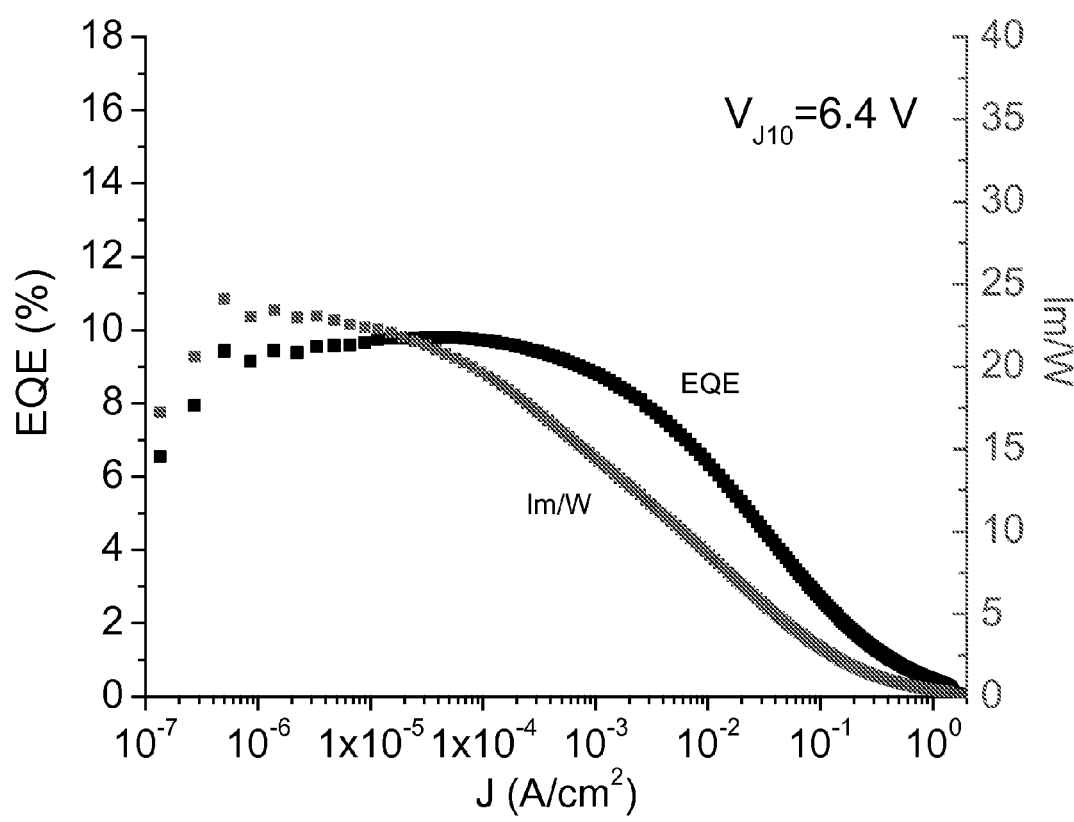
FIG. 8B shows the efficiencies of an organic light emitting device incorporating features from a three-emissive layer device.

FIG. 8A shows the spectra of the device with x=4 nm for current densities of 1, 10, and 100 mA/cm$^2$ (810, 820, 830, respectively); FIG. 8B shows the efficiencies for the same device. The x=4 nm device showed much stronger Ir(ppy)$_3$ emission and exhibited a larger EQE of 9.8%, while the trend with increasing J is opposite to the above 3 devices, i.e., smaller relative Ir(ppy)$_3$ emission at large current density. These data indicate a) Ir(ppy)$_3$ emission from devices with x≧7 nm is not due to migration of excitons formed at the MCP/UGH2 interface, otherwise the emission would decrease as spacer thickness increases; b) a small fraction of excitons formed at the TCTA/MCP interface, and the major exciton formation occurs at the MCP/UGH2 interface due to a large energy barrier for holes between MCP and UGH2 and no barrier for electrons between TCTA and MCP; c) exciton occurrence decreases after migrating more than 7 nm in MCP; d) increasing Ir(ppy)$_3$ emission indicates an increasing fraction of excitons starts to form at TCTA/MCP interface at large J; e) much stronger Ir(ppy)$_3$ emission from the device with x=4 nm is mainly due to migration of excitons formed at MCP/UGH2 interface; f) the opposite trend of Ir(ppy)$_3$ emission indicates the exciton formation zone extends deeper into the FIr6:UGH2 region as J increases, as more holes are injected from the MCP HOMO energy level to the FIr6 HOMO level.

Figure 9A:
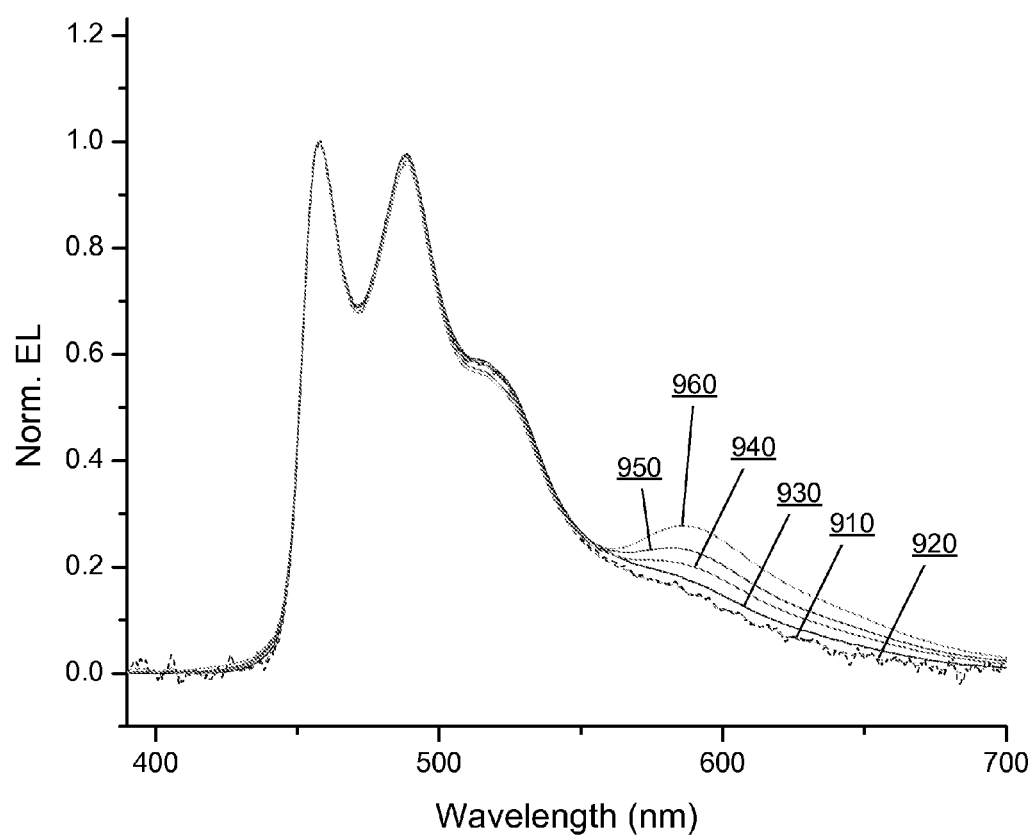
FIG. 9A shows the spectra of an organic light emitting device incorporating features from a three-emissive layer device.
Figure 9B:
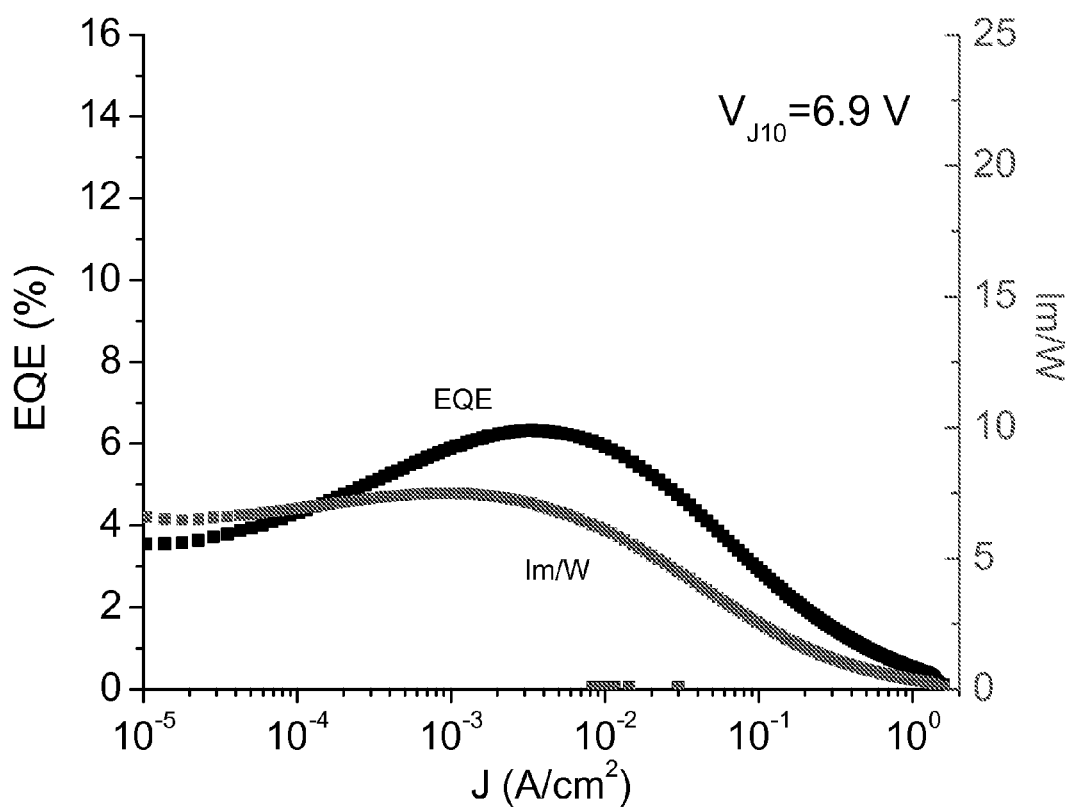
FIG. 9B shows the efficiencies of an organic light emitting device incorporating features from a three-emissive layer device.

Another series of devices (Series B) were also fabricated using the following structures: NPD 37 nm/TCTA 4 nm/PQIr:TCTA 4 nm/(REGION B)/22% FIr6:UGH2 20 nm/BCP 40 nm. The spectra for device with (REGION B)=MCP 11 nm (EQE 14.0%) at current densities of 0.3 mA/cm$^2$ (910), 0.5 mA/cm$^2$ (920), 1.0 mA/cm$^2$ (930), 10 mA/cm$^2$ (940), 30 mA/cm$^2$ (950), and 100 mA/cm$^2$ (960) are shown in FIG. 9A. The device exhibited an EQE of 6.3% and PE of 7.5 lm/W as shown in FIG. 9B. The weak PQIr emission and the increasing trend of it with increasing J are consistent with the above Series A devices with x≧7 nm.

Figure 10A:
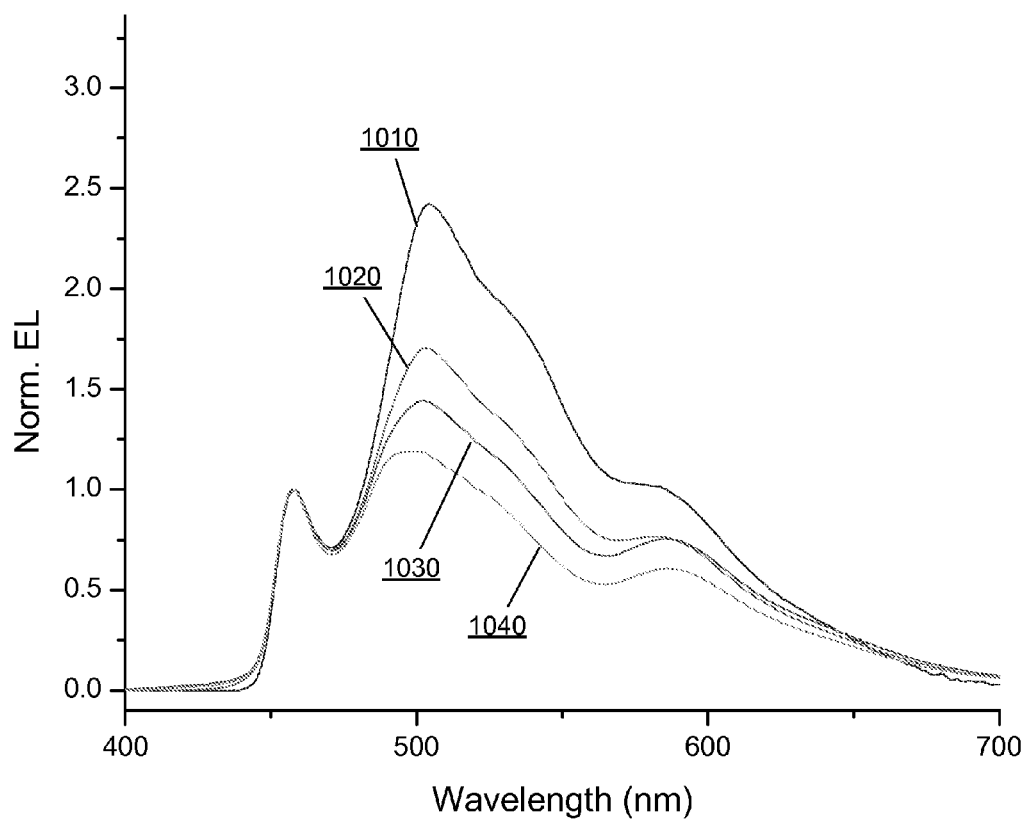
FIG. 10A shows the spectra of an organic light emitting device incorporating features from a three-emissive layer device.
Figure 10B:
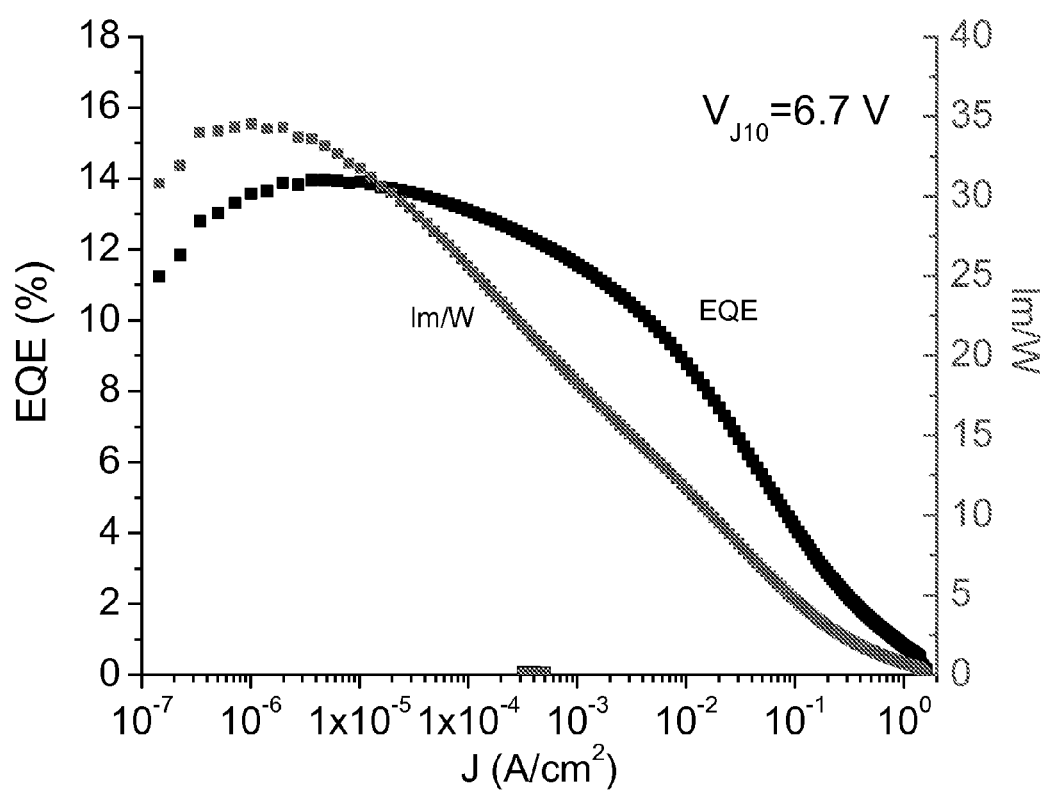
FIG. 10B shows the efficiencies of an organic light emitting device incorporating features from a three-emissive layer device.

FIG. 10A shows the spectra for a device where (REGION B)=MCP 7 nm/1% (Irppy)$_3$: MCP 4 nm (EQE 6.3%) at current densities of 1 mA/cm$^2$ (1010), 10 mA/cm$^2$ (1020), 50 mA/cm$^2$ (1030), and 100 mA/cm$^2$ (1040); FIG. 10B shows the corresponding efficiencies. The strong (Irppy)$_3$ emission and decreasing trend of relative (Irppy)$_3$ emission and increasing trend of relative PQIr emission with increasing J further indicate that a) exciton formation mainly occurs at the MCP/UGH2 interface, and the exciton formation zone extends deeper into the FIr6:UGH2 region as J increases, and b) at large J, an increasing fraction of excitons may form at TCTA/MCP interface as more holes "pile up" at this energy barrier.

Figure 11A:
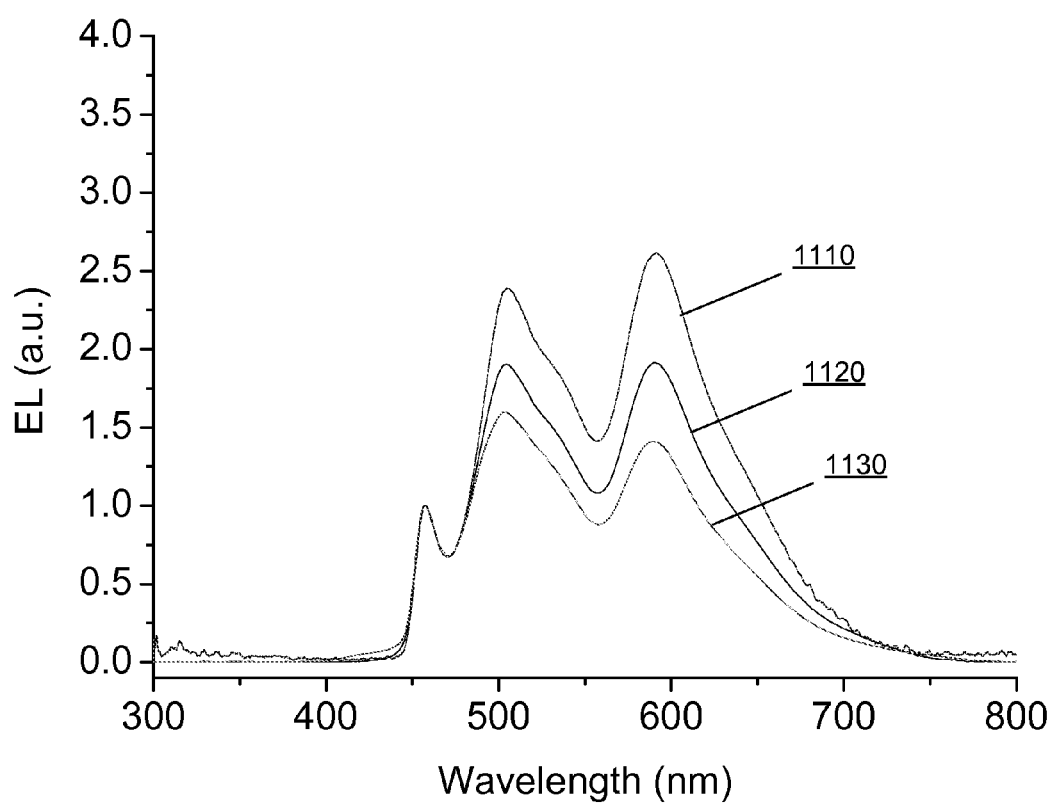
FIG. 11A shows the spectra of an organic light emitting device incorporating features from a three-emissive layer device.
Figure 11B:
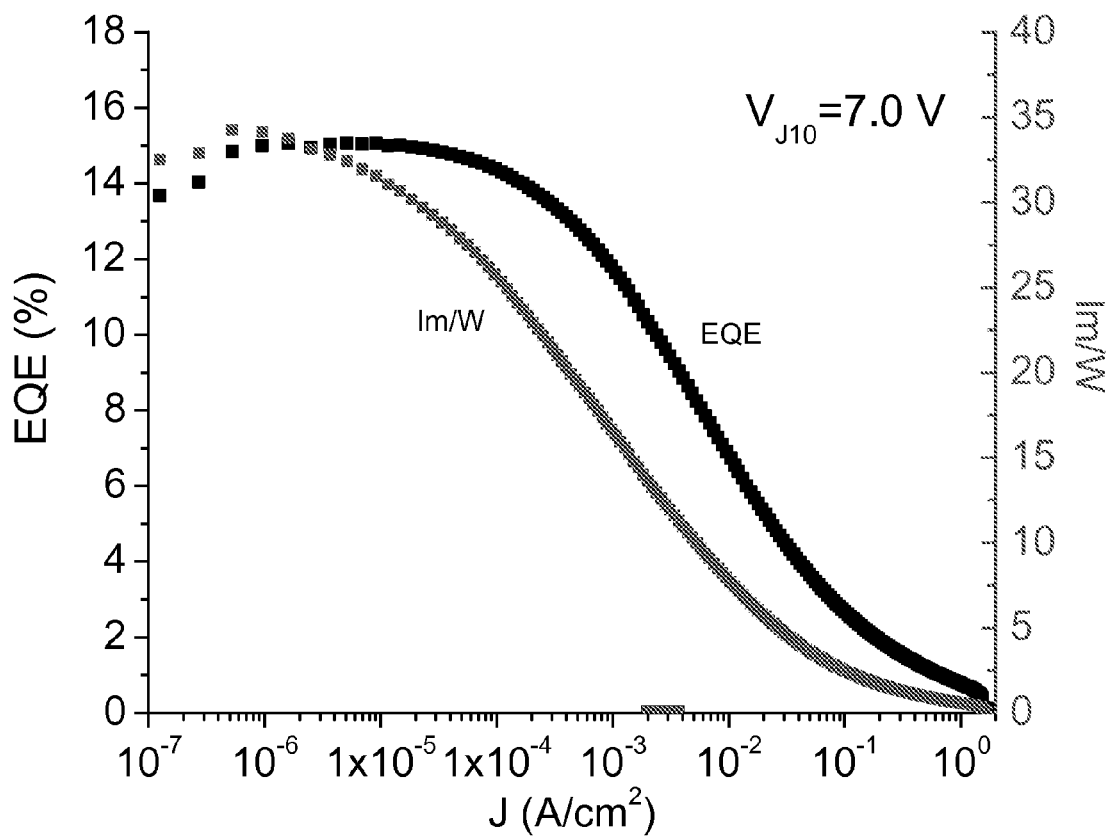
FIG. 11B shows the efficiencies of an organic light emitting device incorporating features from a three-emissive layer device.

FIG. 11A shows the spectra for devices with (REGION B)=1% Ir(ppy)$_3$:MCP 11 nm (EQE=15.0%) at current densities of 1 mA/cm$^2$ (1110), 10 mA/cm$^2$ (1120), and 100 mA/cm$^2$ (1130); FIG. 11B shows the efficiencies as functions of current density for the same devices. The PQIr emission becomes much stronger, and the relative PQIr emission and relative Ir(ppy)$_3$ emission become weaker as J increases. Therefore, it is believed that PQIr emission is mainly due to the energy transfer from the Ir(ppy)$_3$ triplets, which can migrate more than 11 nm from the MCP/UGH2 interface.

Figure 12:
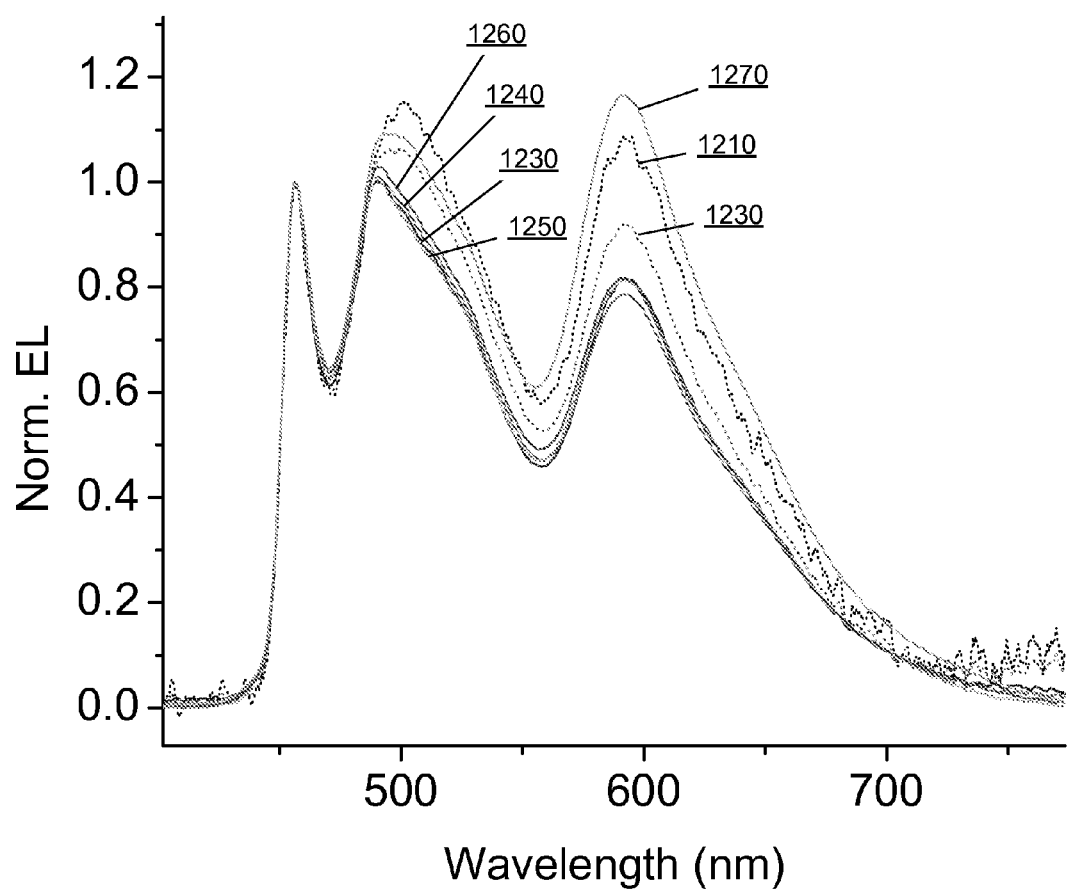
FIG. 12 shows the spectra of a three-emissive layer white-emitting OLED at various current densities.
Figure 13:
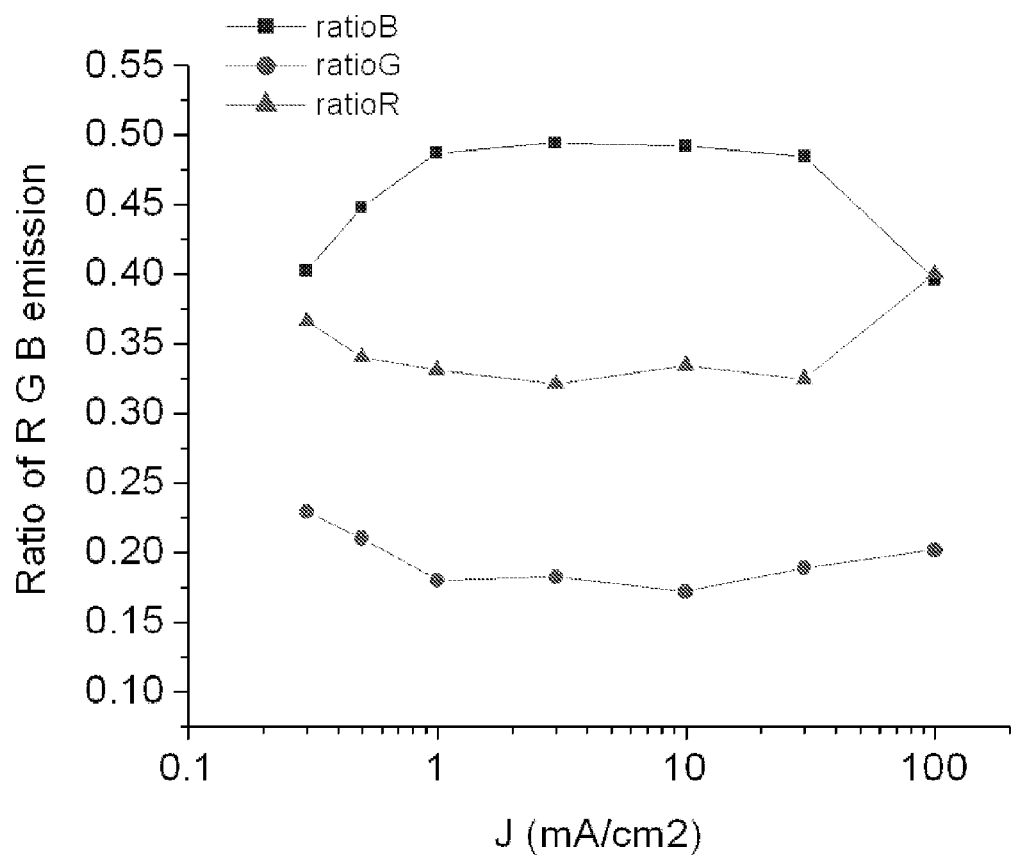
FIG. 13 shows the interpreted ratio of contribution of red, green, and blue emission in the spectra shown in FIG. 12 plotted as a function of current density.

FIG. 12 shows the spectra of a three-EML WOLED at current densities of 0.3 mA/cm$^2$ (1210), 0.5 mA/cm$^2$ (1220), 1.0 mA/cm$^2$ (1230), 3.0 mA/cm$^2$ (1240), 10 mA/cm$^2$ (1250), 30 mA/cm$^2$ (1260), and 100 mA/cm$^2$ (1270). When the current density increases from 1 to 100 mA/cm$^2$, the CIE coordinates shift from (0.340, 0.387) to (0.370, 0.403), and the CRI values remain at 81. It is believed that optimization of a three-EML device as described herein may provide for desirable CIE coordinates within the range (0.33±0.05, 0.33±0.05) and CRI values of at least 80, more preferably at least 90. The interpreted ratio of contribution of red, green, and blue emission in the spectra FIG. 12 is plotted as a function of current density in FIG. 13. The initially blue emission gets stronger with current density, which is consistent with the observation that the exciton formation region extends further into the FIr6:UGH2 layer. At larger current densities, the relative blue emission decreases and relative red emission increases. This is also consistent with the observation that at large current density an increasing fraction of excitons form at the TCTA/MCP interface. In addition, this structure may provide increased device stability, as the interface between the EML and the HBL typically may be a critical issue for long term stability in OLEDs which form excitons at such interface.

The three-EML (red/green/blue) WOLED structure described herein differs from previous devices that used a common host, and hence a single exciton formation region, with its inherent difficulty in obtaining efficient energy transfer from the host to all the three dopants. Also, previously demonstrated 3-EML fluorescent WOLEDs have limited device efficiencies due to the short singlet diffusion length, although excitons in those cases may possibly form in multiple regions across the EML. Finally, the expanded EML prevents the formation of a region of very high exciton density, thereby enhancing efficiency by reducing quenching.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

| | Material Definitions: |
|---|---|
| CBP | 4,4'-N,N-dicarbazole-biphenyl |
| m-MTDATA | 4,4',4''-tris(3-methylphenylphenlyamino)triphenylamine |
| Alq$_3$ | 8-tris-hydroxyquinoline aluminum |
| Bphen | 4,7-diphenyl-1,10-phenanthroline |
| n-Bphen | n-doped BPhen (doped with lithium) |
| F$_4$-TCNQ | tetrafluoro-tetracyano-quinodimethane |
| p-MTDATA | p-doped m-MTDATA (doped with F$_4$-TCNQ) |
| Ir(ppy)$_3$ | tris(2-phenylpyridine)-iridium |
| Ir(ppz)$_3$ | tris(1-phenylpyrazoloto,N,C(2')iridium(III) |
| BCP | 2,9-dimethyl-4,7-diphenyl-1,10-phenanthroline |
| TAZ | 3-phenyl-4-(1'-naphthyl)-5-phenyl-1,2,4-triazole |
| CuPc | copper phthalocyanine |
| ITO | indium tin oxide |
| NPD | N,N'-diphenyl-N-N'-di(1-naphthyl)-benzidine |
| TPD | N,N'-diphenyl-N-N'-di(3-toly)-benzidine |
| BAlq | aluminum(III)bis(2-methyl-8-hydroxyquinolinato)4-phenylphenolate |
| mCP | 1,3-N,N-dicarbazole-benzene |
| DCM | 4-(dicyanoethylene)-6-(4-dimethylaminostyryl-2-methyl)-4H-pyran |

-continued

| | Material Definitions: |
|---|---|
| DMOA | N,N'-dimethylquinacridone |
| PEDOT:PSS | an aqueous dispersion of poly(3,4-ethylenedioxythiophene) with polystyrenesulfonate (PSS) |
| hfac | hexafluoroacetylacetonate |
| 1,5-COD | 1,5-cyclooctadiene |
| VTES | vinyltriethylsilane |
| BTMSA | bis(trimethylsilyl)acetylene |
| Ru(acac)$_3$ | tris(acetylacetonato)ruthenium(III) |
| C$_{60}$ | Carbon 60 ("Buckminsterfullerene") |

EXPERIMENTAL

Specific representative embodiments of the invention will now be described, including how such embodiments may be made. It is understood that the specific methods, materials, conditions, process parameters, apparatus and the like do not necessarily limit the scope of the invention.

Multi-EML OLEDs were prepared in high-vacuum (10-7 Torr) by thermal evaporation of organic layers onto glass substrates precoated with a clean, 150-nm-thick, ~20 Ω/sq indium tin oxide (ITO) layer using procedures published elsewhere. 14 First, a 40-nm-thick film of 4,4'-bis[N-(1-naphthyl)-N-phenyl-amino]-biphenyl (NPD) as the hole transport layer (HTL) was deposited, followed by the multiple-section EML, and then capped by an electron transport layer (ETL) of either a 40-nm-thick 2,9-dimethyl-4,7-diphenyl-1,10-phenanthroline (BCP) layer, or a 20-nm-thick 4,7-diphenyl-1,10-phenanthroline (BPhen) layer followed by a second, 20-nm-thick BPhen layer mixed with Li in a 1:1 molar ratio. Finally, a 0.8-nm-thick LiF and a 60-nm-thick Al layer cathode was deposited through a shadow mask with an array of circular, 1.0 mm-diameter openings. Current density (J)-voltage (V) and luminance measurements were obtained using a semiconductor parameter analyzer and a calibrated Si photodiode following standard procedures.

Figure 14:
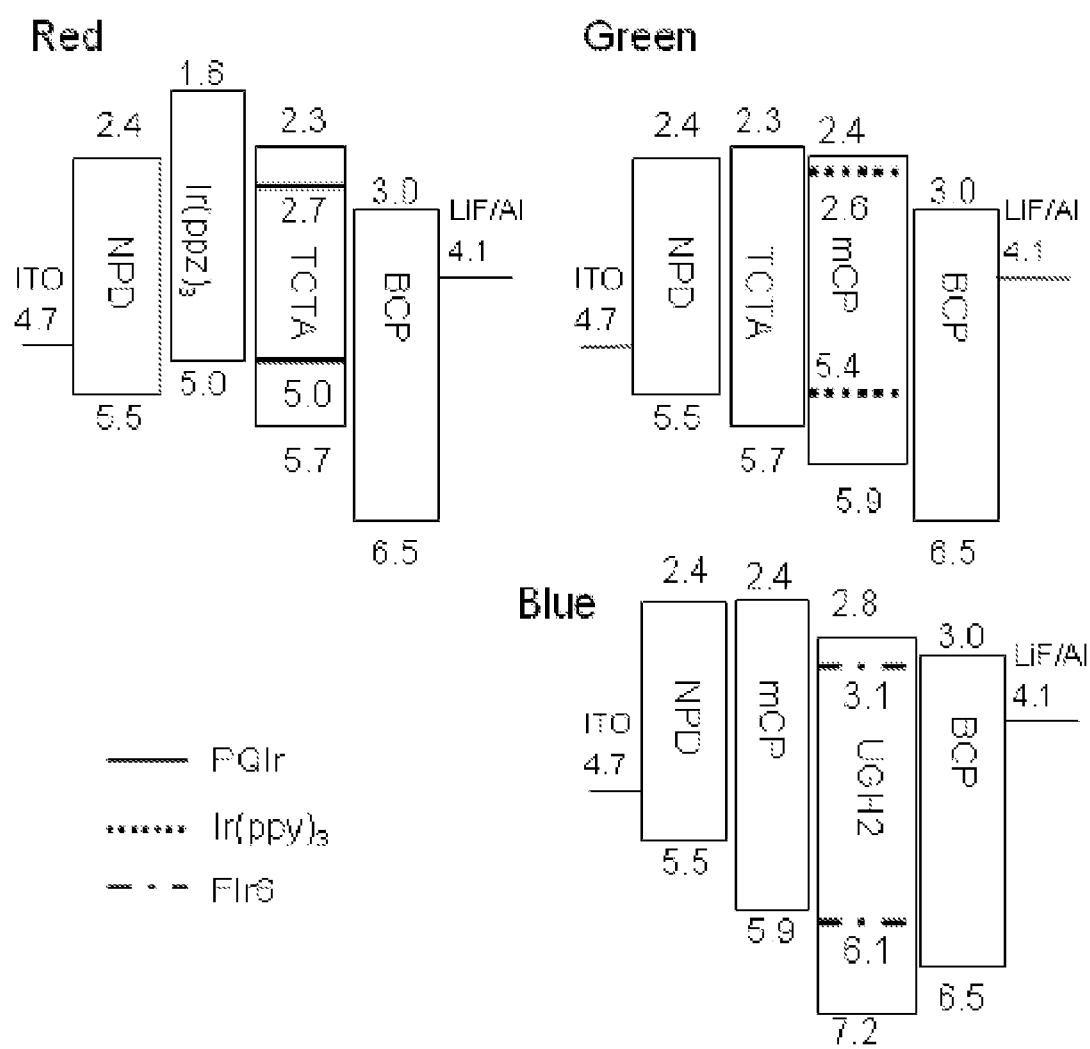
FIG. 14 shows the spectra of an organic light emitting device incorporating features from a three-emissive layer device.
Figure 15:
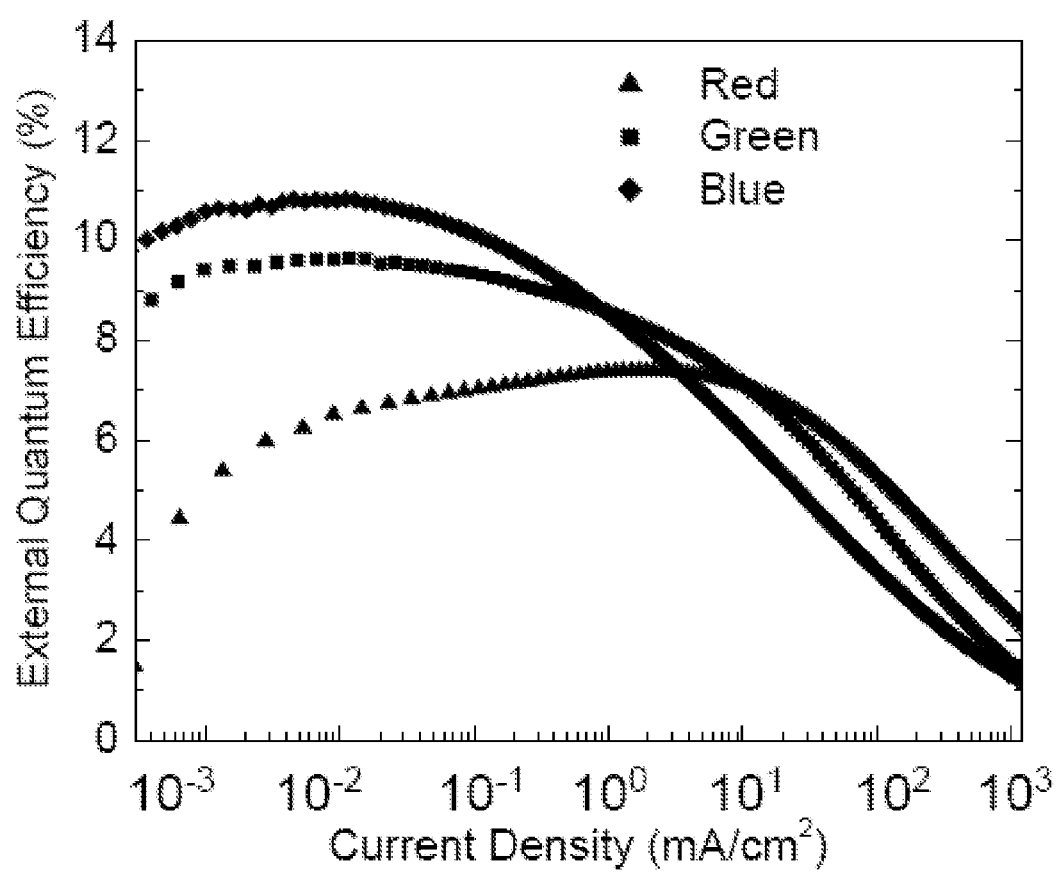
FIG. 15 shows the efficiencies of an organic light emitting device incorporating features from a three-emissive layer device.

Ir(III) bis-(2-phenylquinolyl-N,C2') acetylacetonate (PQIr), tris-(phenylpyridine)iridium (Ir(ppy)3), and bis-(4',6'-difluorophenylpyridinato) tetrakis(1-pyrazolyl)borate (FIr6) were used as phosphorescent dopants for the R, G, and B emission, respectively. To optimize and characterize the host materials for each of the dopants, three monochromatic devices were fabricated with the following structure: NPD (40 nm)/hole injection layer (HIL) (10 nm)/EML (20 nm)/BCP (40 nm), with the HIL/EML combinations of tris(phenylpyrazole) iridium (Ir(ppz)3)/8 wt % PQIr: 4,4',4''-tris-(N-carbazolyl)-triphenylamine (TCTA) for red, TCTA/10 wt % Ir(ppy)3: N,N'-dicarbazolyl-3,5-benzene (mCP) for green, and mCP/8 wt % FIr6: p-bis-(triphenylsilyl)benzene (UGH2) for blue emission. FIG. 14 shows the schematic energy level diagrams of the three devices. The highest occupied (HOMO) and lowest unoccupied molecular orbital (LUMO) energies are extracted from the literature. These monochromatic devices exhibit peak forward-viewing external quantum efficiencies (EQE) between (7.4±0.5) % and (10.8±0.6) % as shown in FIG. 15, which is typical of electrophosphorescent OLEDs based on these dopants.

Figure 16:
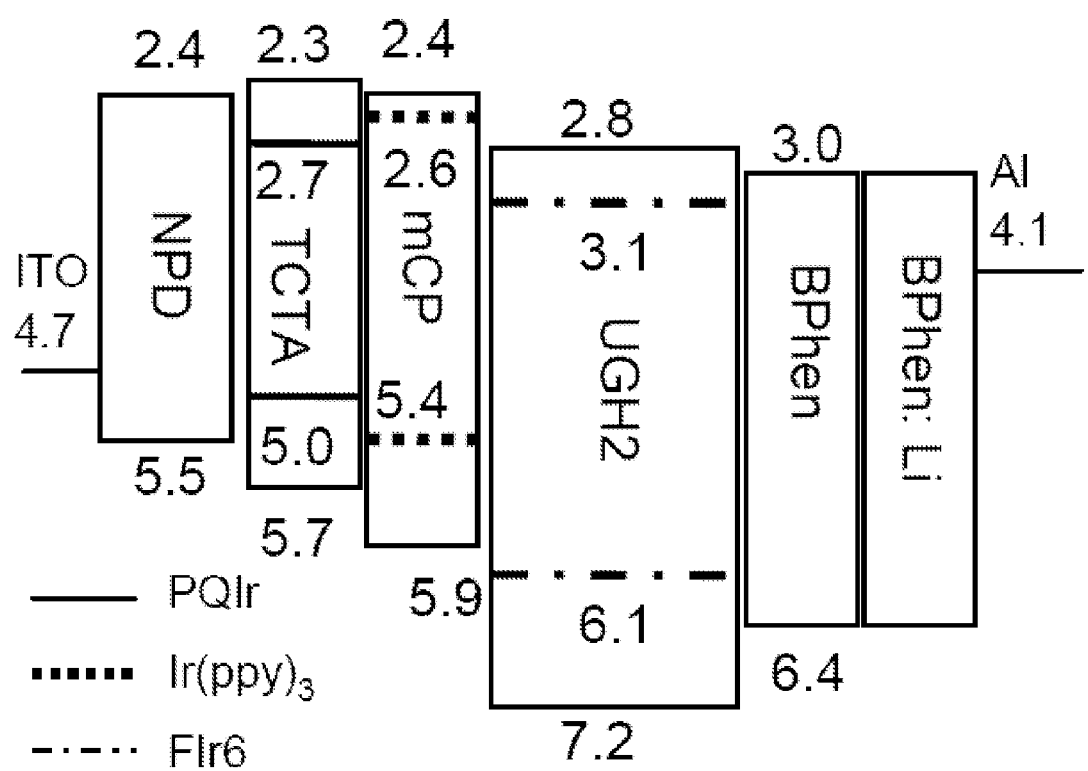
FIG. 16 shows a schematic diagram of an optimized three-emissive layer OLED.

In the 3-EML WOLED, the three hosts were arranged in the order of TCTA/mCP/UGH2 to form a stepped progression of HOMO levels from TCTA (5.7 eV), to mCP (5.9 eV), to UGH2 (7.2 eV). The energy barrier for holes is larger at the mCP/UGH2 interface compared to that at the TCTA/mCP interface, resulting in a larger exciton density at the former interface. To reduce the accumulation of holes, FIr6 was doped at 20 wt % in UGH2 to promote charge injection directly onto the dopant. The white color balance and the efficiency of the 3-EML WOLED were optimized by adjusting the doping levels and the thicknesses of the red and green EMLs. The optimized structure is NPD (40 nm)/4 wt % PQIr:TCTA (5 nm)/2 wt % Ir(ppy)3:mCP (8 nm)/20 wt % FIr6:UGH2 (20 nm)/ETL (40 nm) as shown in FIG. 16. Here, the ETL consists of a 20-nm-thick BPhen layer followed by a second, 20-nm-thick BPhen layer mixed with Li in a 1:1 molar ratio to reduce the drive voltage, and thus enhance the power efficiency (PE).

Figure 17:
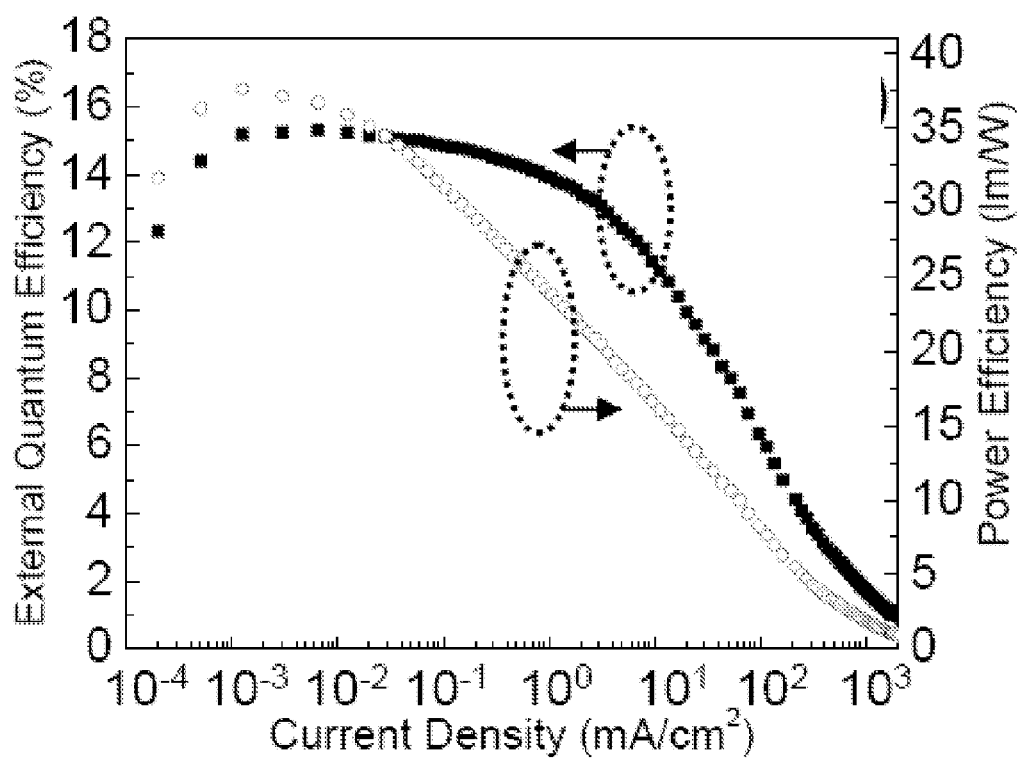
FIG. 17 shows the forward-viewing EQE and PE as functions of current density of a three-emissive layer white OLED.

The forward-viewing EQE and PE as functions of current density of the 3-EML WOLED are shown in FIG. 17. The peak forward-viewing EQE is ηext=(15.3±0.8) % at J=12 μA/cm2, and the peak PE is ηp=(38±2) lm/W at J=1.3 μA/cm2. Notably, the EQE is significantly higher than for the optimized monochrome devices fabricated using the same material combinations. This provides strong evidence that exciton formation occurs in multiple zones within the three-EML WOLED.

Since efficient lamp fixtures can be used to redirect the emission into the space being illuminated, the corresponding total efficiencies peak are ηext,t=(26±1) % and $\eta_{p,t}$=(64±3) lm/W. The voltage at J=10 mA/cm2 is VJ10=5.0V. The current density where $\eta_{ext}$ has declined by half from its peak is J0=(60±6)mA/cm2, or three times larger than that of previously reported phosphorescent WOLEDs. Moreover, when the luminance increases, the WOLED exhibits $\eta_{ext,t}$=(23±1) % and ηp,t=(38±2) lm/W at 500 cd/m2, and $\eta_{ext,t}$=(22±1) % and $\eta_{p,t}$=(34±2) lm/W at 1000 cd/m2.

A second device fabricated with an ETL consisting of a 40-nm-thick BCP layer showed a higher peak $\eta_{ext,t}$=(28±1) %, although $\eta_{p,t}$ was reduced to (54±3) lm/W due to the increased drive voltage. Nevertheless, for an OLED output coupling efficiency of 20%, the nearly unity internal quantum efficiency of (83±7) % was obtained. It is therefore believed that internal quantum efficiencies approaching and including 100% are achievable using the techniques and arrangements described herein.

Figure 18:
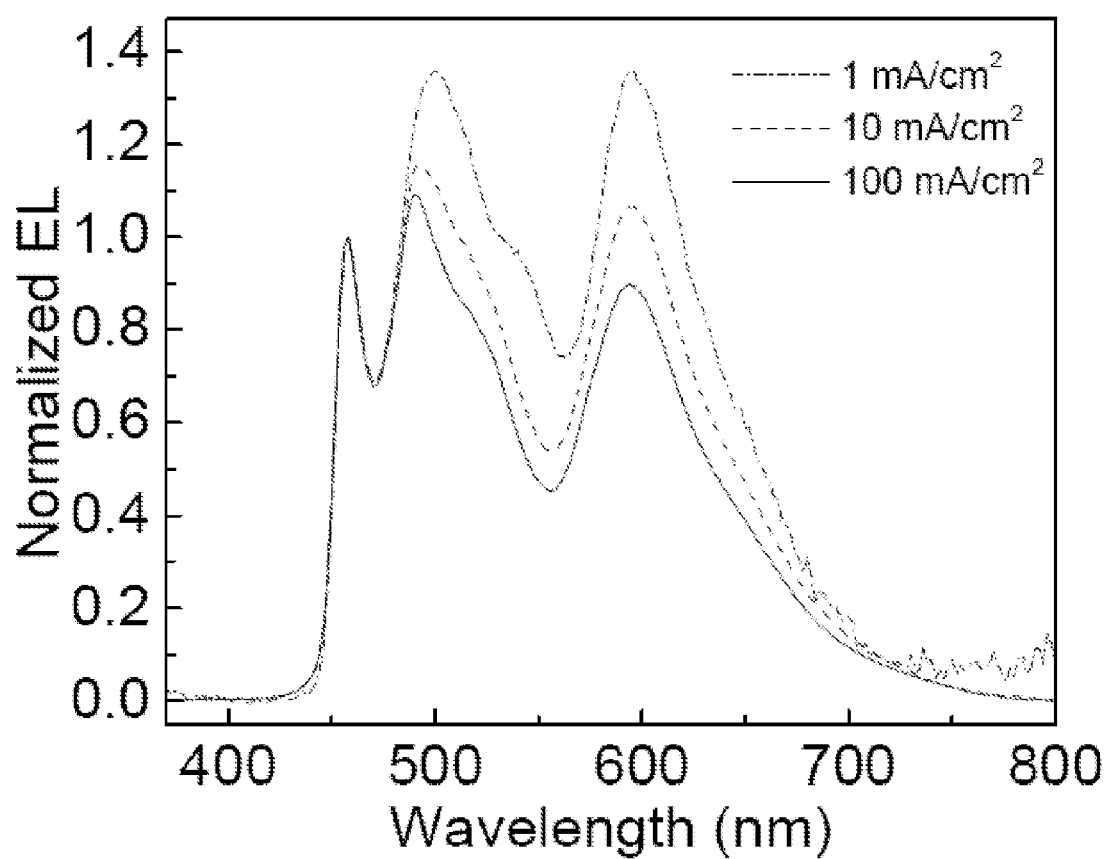
FIG. 18 shows the electroluminescence spectra at various current densities for a three-emissive layer white OLED.

FIG. 18 shows the electroluminescence spectra at various current densities. The Commission Internationale de L'Eclairage (CIE) coordinates and the CRI values are, respectively, (0.37, 0.41) and 81 at J=1 mA/cm2, and (0.35, 0.38) and 79 at J=100 mA/cm$^2$. The spectra of the 3-EML WOLED show a trend of increasing FIr6 intensity relative to Ir(ppy)$_3$ and PQIr emission with increasing J, where an increasing fraction of holes are directly injected onto FIr6. This moves the exciton formation zone further into the FIr6:UGH2 region of the EML.

It is believed that the external quantum efficiency of the 3-EML WOLED is higher than that of the monochromatic devices in using the same dopants since a) a large fraction of excitons generated at the hole injection layer (HIL)/EML interface in the monochromatic devices diffuse to the HIL side and eventually decay through non-radiative or low-efficiency emission channels on the undoped HIL molecules; and b) the energy barrier to holes at HTL/HIL interface in the monochromatic devices may result in exciton formation away from the doped EML, preventing diffusion into the emission region. The efficiency of the 3-EML WOLED is also higher than for previously reported all-phosphorescent-doped WOLEDs with high CRI, primarily due to the stepped progression of HOMO levels of the hosts that forms a series of energy barriers to hole transport. This allows a distribution of excitons to form in multiple regions. Finally, the host in each EML has its HOMO (or LUMO) energy aligned to the HOMO (or LUMO) of the dopant in the adjacent EML. For example, the HOMO of mCP (5.9 eV) aligns with that of FIr6 (6.1 eV), and TCTA (5.7 eV) with Ir(ppy)$_3$ (5.4 eV), whereas the LUMO of UGH2 (2.8 eV) aligns with that of Ir(ppy)$_3$ (2.6 eV). This promotes resonant injection of holes (electrons) into the HOMO (LUMO) of the dopant molecules in the adjacent EML. The resulting dopant cations (anions) capture electrons (holes) from the host to form excitons, leading to further broadening of the exciton formation regions, and high efficiency even at high brightness.

Thus, WOLED composed of three separate phosphorescent emission layers as described herein may exhibit a distribution of excitons formation in multiple regions across the broad EML. The selection of dopant-host materials and their deposition sequence in the EMLs leads to high efficiency at high brightness required for interior illumination applications. The 3-EML WOLED has $\eta_{ext,t}$=(26±1) % and $\eta_{p,t}$= (64±3) lm/W, when using an n-type doped ETL. The total EQE was further enhanced to $\eta_{ext,t}$=(28±1) % when the ETL is replaced by an undoped BCP layer. The WOLED has near unity internal quantum efficiency achieved using conventional commercially-available dopants.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising:
   an anode;
   a cathode; and
   a stacked emissive region disposed between the anode and the cathode, the stacked emissive region comprising:
   a first organic emissive layer comprising a first dopant and a first host;
   a second organic emissive layer comprising a second dopant and a second host; and
   a third organic emissive layer comprising a third dopant and a third host;
   wherein:
   the first host, second host, and third host are different from each other; and
   the first organic emissive layer has an emission peak different from at least one of the second emissive layer and the third emissive layer.

2. The device of claim 1, wherein the HOMO of each host is aligned to the HOMO of an adjacent dopant.

3. The device of claim 2, wherein the HOMO of at least one host is within 5 kT-10 kT of the HOMO of an adjacent dopant.

4. The device of claim 3, wherein the LUMO of at least one host is within 5 kT-10 kT of the HOMO of an adjacent dopant.

5. The device of claim 3, wherein the LUMO of each host is within 5 kT-10 kT of the HOMO of an adjacent dopant.

6. The device of claim 2, wherein the HOMO of each host is within 5 kT-10 kT of the HOMO of an adjacent dopant.

7. The device of claim 2, wherein the first dopant, second dopant, and third dopant are different from each other.

8. The device of claim 1, wherein the LUMO of each host is aligned to the LUMO of an adjacent dopant.

9. The device of claim 1, wherein:
the HOMO of the second dopant is between the HOMO of the first host and the HOMO of the first dopant; and
the HOMO of the second dopant is aligned to the HOMO of the first host and to the HOMO of the first dopant.

10. The device of claim 1, wherein:
the LUMO of the second host is between the LUMO of the first host and the LUMO of the first dopant; and
the LUMO of the second host is aligned to the LUMO of the first host and to the LUMO of the first dopant.

11. The device of claim 1, wherein, for each emissive layer, the HOMO of the host is aligned to the HOMO of each adjacent emissive layer host and to the HOMO of each adjacent emissive layer dopant.

12. The device of claim 1, wherein, for each emissive layer, the LUMO of the host is aligned to the LUMO of each adjacent emissive layer host and to the LUMO of each adjacent emissive layer dopant.

13. The device of claim 1, wherein at least one of the dopants is a phosphorescent dopant.

14. The device of claim 1, wherein at least one of the dopants is a fluorescent dopant.

15. The device of claim 1, wherein a combined emission of the organic emissive layers sufficiently spans the visible spectrum to produce white light.

16. The device of claim 15, wherein the white light has a CRI of at least about 80.

17. The device of claim 15, wherein the white light has CRE coordinates in the range (0.33±0.05, 0.33±0.05).

18. The device of claim 1, wherein at least one organic emissive layer comprises a non-polymeric material.

19. The device of claim 1, wherein at least one organic emissive layer comprises a polymer.

20. The device of claim 1, wherein each of the organic emissive layers defines an exciton formation region.

21. An organic optoelectronic device, comprising:
a first organic emissive layer comprising a first host and a first dopant adapted to emit light having a first spectrum;
a second organic emissive layer comprising a second host and a second dopant adapted to emit light having a second spectrum, the second host having a LUMO between and aligned to the LUMO of the first host and the LUMO of the first dopant; and
a third organic emissive layer comprising a third host and a third dopant adapted to emit light having a third spectrum, the third host having a LUMO between and aligned to the LUMO of the second host and the LUMO of the second dopant.

22. The device of claim 21, wherein a combined emission of the emissive layers sufficiently spans the visible spectrum to produce white light.

23. The device of claim 21, wherein:
the second host has a HOMO between and aligned to the HOMO of the first host and the HOMO of the first dopant; and
the third host has a HOMO between and aligned to the HOMO of the second host and the HOMO of the second dopant.

24. The device of claim 21, wherein the first host, second host, and third host are different from each other.

25. A method of fabricating an optoelectronic device, comprising:
obtaining a substrate;
depositing a first electrode over the substrate;
depositing a first doped organic emissive layer comprising a first dopant and a first host over the first electrode;
depositing a second doped organic emissive layer comprising a second dopant and a second host over the first emissive layer;
depositing a third doped organic emissive layer comprising a third dopant and a third host over the second emissive layer; and
depositing a second electrode over the third emissive layer;
wherein the first host, second host, and third host are different from each other.

26. The method of claim 25, wherein a combined emission of the emissive layers sufficiently spans the visible spectrum to produce white light.

27. The method of claim 25, wherein each emissive layer host has an energy level aligned to a corresponding energy level of a dopant in an adjacent emissive layer.

28. The method of claim 27, wherein the first dopant, second dopant, and third dopant are different from each other.

29. The method of claim 25, wherein each of the organic emissive layers defines an exciton formation region.

* * * * *

UNITED STATES PATENT AND TRADEMARK OFFICE
CERTIFICATE OF CORRECTION

PATENT NO. : 8,143,613 B2
APPLICATION NO. : 11/945910
DATED : March 27, 2012
INVENTOR(S) : Forrest et al.

It is certified that error appears in the above-identified patent and that said Letters Patent is hereby corrected as shown below:

Title Page, Item (12) "Forrest" should read --Forrest et al.--.

Title Page, Item (75) Inventor: Stephen R. Forrest, Ann Arbor, MI (US)" should read --(75) Inventors: Stephen R. Forrest, Ann Arbor, MI (US); Yiru Sun, Hoboken, NJ (US)--.

Signed and Sealed this
Twenty-ninth Day of May, 2012

David J. Kappos
*Director of the United States Patent and Trademark Office*